United States Patent [19]
Furuhata et al.

[11] Patent Number: 6,122,192
[45] Date of Patent: Sep. 19, 2000

[54] NON-VOLATILE SEMICONDUCTOR MEMORY DEVICE AND FABRICATION METHOD THEREOF

[75] Inventors: Tomoyuki Furuhata; Koji Kato, both of Sakata, Japan

[73] Assignee: Seiko Epson Corporation, Tokyo, Japan

[21] Appl. No.: 09/250,303

[22] Filed: Feb. 16, 1999

[30] Foreign Application Priority Data

Feb. 17, 1998 [JP] Japan ................................... 10-051358

[51] Int. Cl.[7] .................................................. G11C 13/00
[52] U.S. Cl. ...................................... 365/185.01; 365/175
[58] Field of Search ............................... 365/175, 185.01, 365/185.1, 189.06

[56] References Cited

U.S. PATENT DOCUMENTS 5,978,258  11/1999  Manning ................................. 365/175

FOREIGN PATENT DOCUMENTS 7-244991  9/1995  Japan .

OTHER PUBLICATIONS

*Nikkei Microdevices*, Oct. 1988, pp. 102–111.

*Primary Examiner*—Terrell W. Fears
*Attorney, Agent, or Firm*—Oliff & Berridge, PLC

[57] ABSTRACT

A non-volatile semiconductor memory device is provided with a circuit that protects a tunnel oxide film from the charging phenomenon. This circuit comprises a first junction diode including an $N^+$-type diffusion layer and a P-type well, and a second junction diode including a P-type well and an N-type well. When a voltage applied to the control gate is greater than all of a write voltage, a read voltage, and an erasure voltage that would be applied to the control gate, a current is guided through that circuit.

20 Claims, 16 Drawing Sheets

PROTECTIVE CIRCUIT PORTION

NON-VOLATILE SEMICONDUCTOR MEMORY DEVICE AND FABRICATION METHOD THEREOF

BACKGROUND OF THE INVENTION

1. Field of the Invention

The present invention relates to a non-volatile semiconductor memory device and, in particular, to a non-volatile semiconductor memory device having a memory element provided with a floating gate and a control gate, as well as to a method of fabricating such a device.

2. Description of Related Art

In a non-volatile semiconductor memory device that has a memory element provided with a floating gate and a control gate, such as flash EEPROM, data is programmed or erased by injecting or removing charge from the floating gate by Fowler-Nordheim (FN) tunneling or channel hot electrons (CHE) through a tunnel oxide film that is formed of a thin oxide film to a thickness of approximately 10 nm on top of a semiconductor substrate.

With a non-volatile semiconductor memory device of this type, the lifetime of the tunnel oxide film varies with the amount of charge that passes therethrough, so that the tunnel oxide film will break down when the quantity of this through charge exceeds a certain value. The quantity of through charge that leads to break-down of the tunnel oxide film is expressed by $Q_{bd}$. Thus the number of times that such a non-volatile semiconductor memory device can be programmed to and erased depends on the magnitude of $Q_{bd}$, so it is desirable to increase the magnitude of $Q_{bd}$ in order to increase the number of program/erase cycles.

In general, the intrinsic value of $Q_{bd}$ for an oxide film (hereinafter called $Q_i$) is determined by the method by which it was formed, however, when a phenomenon occurs such that a charge passes through the tunnel oxide film during the fabrication process after the tunnel oxide film is formed, $Q_{bd}$ falls to a value which is less than the intrinsic value $Q_i$ for the amount of the charge of $Q_p$ that is the amount of charge that passes through the tunnel oxide film during the fabrication process after the tunnel oxide film is formed. It is therefore necessary to ensure that the semiconductor substrate does not become charged during the fabrication process after the tunnel oxide film is formed, to prevent the above-mentioned phenomenon.

However, various different charging phenomena can occur in practice during processes such as ion implantation and plasma etching process (as discussed on page 103 of the October 1988 issue of Nikkei Microdevices, for example), so it is difficult to avoid this deterioration in the $Q_{bd}$ of the tunnel oxide film. One method of solving this problem is a method designed to prevent charging of the apparatus for fabricating semiconductor devices, but this causes a further problem, that is, it results in increase in the cost of fabricating non-volatile semiconductor memory devices.

The technique disclosed in Japanese Patent Application Laid-Open No. 7-244991 was devised to solve this problem. A cross-sectional view through the structure of a non-volatile semiconductor memory device disclosed in Japanese Patent Application Laid-Open No. 7-244991 is shown in FIG. 24, and an equivalent circuit diagram is shown in FIG. 25.

As shown in FIG. 24, field oxide films 156 are provided at intervals on the surface of a P-type semiconductor substrate 154. A channel stopper region 158 is formed below each of the field oxide films 156. This non-volatile semiconductor memory device comprises a memory cell portion and a protective circuit portion. Within the memory cell portion, a tunnel oxide film 160 is formed in a region defined by the field oxide layers 156, on the main surface of the semiconductor substrate 154. A floating gate 162 is formed on the tunnel oxide film 160, and a structure known as an ONO film 164, consisting of a stack of a silicon oxide film, a silicon nitride film, and a silicon oxide film is formed over the floating gate 162. A control gate 166 is then formed to cover the ONO film 164. A memory transistor 176 is comprised by the tunnel oxide film 160, the floating gate 162, the ONO film 164, and the control gate 166.

Within the protective circuit portion, a dielectric film 171 is formed in the region defined by the field oxide layers 156, of the surfaces of the semiconductor substrate 154. An N⁺-type diffusion layer 168 is formed within the semiconductor substrate 154, below the dielectric film 171. The control gate 166 extends as far as above the dielectric film 171, and a MOS capacitor 172 is created by this extension portion of the control gate 166, the dielectric film 171, and the N⁺-type diffusion layer 168. A junction diode 174 is formed between the N⁺-type diffusion layer 168 and the semiconductor substrate 154.

The MOS capacitor 172 and the junction diode 174 form a protective circuit that prevents deterioration of the tunnel oxide film 160. In other words, when the control gate 166 is charged during the process of fabricating the semiconductor device, the tunnel oxide film 160 is protected from the charging phenomenon by this protective circuit guiding the charge therethrough.

However, the quality of the dielectric film 171 of the MOS capacitor 172 could be damaged by repeated application of charge to the control gate 166, so the function thereof as a protective circuit deteriorates. If this continues, the dielectric film 171 could be broken down. In such a case, the protective circuit function would be lost.

In addition, this technique also increases the steps required for fabricating the non-volatile semiconductor memory device, because a capacitor formation step for forming the MOS capacitor 172 is added to the ordinary fabrication process, as a result of forming the dielectric film 171 on the N⁺-type diffusion layer 168 and then extending the control gate 166 as far as thereabove.

SUMMARY OF THE INVENTION

An objective of the present invention is to provide a non-volatile semiconductor memory device having a protective circuit that is applicable to a device wherein memory elements are activated by the use of positive and negative voltages to control gates thereof, without any impairment of the functions thereof even when charges are repeatedly applied.

Another objective of the present invention is to provide a method of fabricating a non-volatile semiconductor memory device having a protective circuit that is applicable to a device wherein memory elements are activated by the use of positive and negative voltages to control gates thereof, without any impairment of the functions thereof even when charges are repeatedly applied.

The present invention relates to a non-volatile semiconductor memory device comprising a semiconductor substrate and a memory element that is provided with a floating gate and a control gate. A circuit formed of a first junction diode and a second junction diode acts as a protective circuit that protects the tunnel insulation film from the charging phenomenon. This protective circuit is connected electrically to the control gate.

A reverse voltage is applied to a first junction diode when a positive voltage is applied to the control gate, and the first junction diode conducts a reverse current therethrough when a positive voltage applied to the control gate is greater than any of a programming voltage, a read voltage, and an erasing voltage that are applied to the control gate.

A second junction diode is connected electrically to the first junction diode and functions in such a manner that a reverse voltage is applied thereto when a negative voltage is applied to the control gate, and the second junction diode conducts a reverse current therethrough when a negative voltage applied to the control gate has an absolute value that is greater than any of a programming voltage, a read voltage, and an erasing voltage that are applied to the control gate. The present invention therefore makes it possible to protect the tunnel insulation film from the charging phenomenon, in a non-volatile semiconductor memory device wherein positive and negative voltages are applied to control gates to activate memory elements.

If a MOS capacitor were used as a protective circuit, the charge would damage the dielectric film and impair the protective circuit function, but the use of junction diodes in accordance with the present invention ensures that there is no need for such a dielectric film in the junction diodes, and such a problem does not arise. The non-volatile semiconductor memory device of the present invention has the aspects described below.

A first aspect of the non-volatile semiconductor memory device of the present invention is the formation of a protective circuit within the semiconductor substrate to protect the tunnel insulation film from the charging phenomenon.

A second aspect of the non-volatile semiconductor memory device of the present invention is the configuration of first and second junction diodes as described below. The first junction diode comprises a first conductive region formed within the semiconductor substrate, and a second conductive region that is formed within the semiconductor substrate; in electrical contact with the first conductive region; and having a conductivity opposite to that of the first conductive region. The second junction diode comprises the second conductive region and a third conductive region that is formed within the semiconductor substrate; in electrical contact with the second conductive region; and having the same conductivity as that of the first conductive region.

A third aspect of the non-volatile semiconductor memory device of the present invention is the configuration of the first and second junction diodes as described below. The second junction diode includes a first well formed within the semiconductor substrate, and in a second well formed within the first well, having a conductivity opposite to that of the first well. The first junction diode includes the second well and a first conductive layer formed within the second well, having the same conductivity as that of the first well. The first conductive layer is in electrical contact with the control gate.

In this third aspect, the control gate is preferably connected electrically to the first conductive layer by extending to the first conductive layer. The reason for this is to make it possible to protect the tunnel insulation film from the charging phenomenon immediately after the formation of the control gate. In other words, in case the control gate did not extend to the first conductive layer, it is not possible to protect the tunnel insulation film from the charging phenomenon until the control gate and the first conductive layer had been connected electrically.

The third aspect preferably further comprises a first channel stopper region formed within the second well. The first channel stopper region and the first conductive layer are formed with an interval provided therebetween so that the first channel stopper region and the first conductive layer are not electrically conductive when any of the write voltage, read voltage, and erasure voltage is applied thereto. If this interval is not provided, the first channel stopper region and the first conductive layer will come into contact. Since the first channel stopper region has a comparatively high impurity density, current can easily flow therethrough. Thus, when a voltage is applied to the control gate to activate the memory element, a current would flow from the first conductive layer to the first channel region, then leak into the substrate, this would cause the voltage at the control gate to drop, and it will therefore no longer be possible to activate the memory element. Such a phenomenon can be preventing by providing the interval between the first channel stopper region and the first conductive layer.

In the third aspect of the present invention, the interlayer dielectric film and the wiring layer are preferably provided as described below. The interlayer dielectric film has a first contact hole through which the control gate is exposed and a second contact hole through which the first conductive layer is exposed. The wiring layer is formed on the interlayer dielectric film so that the control gate and the first conductive layer are connected electrically through the first and second contact holes. In this manner, the wiring layer is formed on the interlayer dielectric film that has the first and second contact holes, so that the control gate and the first conductive layer are placed in electrical contact by the wiring layer. Since this connection step can be done simultaneously with the steps of connecting other wiring layers, there is no need for a separate step of connecting just the control gate to the first conductive layer, and thus the process of fabricating the non-volatile semiconductor memory device can be simplified.

A fourth aspect of the non-volatile semiconductor memory device of the present invention is the provision of a plurality of memory elements and a plurality of access transistors for selectively activating the memory elements, wherein each access transistor selectively activates only one memory element.

This fourth aspect of the present invention is preferably also provided with a circuit for preventing deterioration of the gate insulation film of the access transistor, which would be caused by the phenomenon of the gate electrode of the access transistor becoming charged. This circuit comprises third and fourth junction diodes. The third junction diode functions in such a manner that a reverse voltage is applied thereto when a positive voltage is applied to a gate electrode of the access transistor, and the third junction diode conducts a reverse current therethrough when a positive voltage applied to the gate electrode is greater than a positive voltage applied to the gate electrode, in order to selectively activate the memory element.

The fourth junction diode is connected electrically to the third junction diode and functions in such a manner that a reverse voltage is applied thereto when a negative voltage is applied to the gate electrode, and the fourth junction diode conducts a reverse current therethrough when a negative voltage applied to the gate electrode has an absolute value that is greater than that of a negative voltage applied to the gate electrode, in order to selectively activate the memory element.

A circuit formed of the third junction diode and the fourth junction diode is connected electrically to the gate electrode.

This ensures that the gate electrode of each access transistor is connected electrically to a protective circuit that protects the gate insulation film from the charging phenomenon. Thus the gate insulation film of the access transistor can be protected from any deterioration that would be caused by the charging phenomenon.

In a fifth aspect of the non-volatile semiconductor memory device of the present invention, the second junction diode comprises the semiconductor substrate and a first well which is formed within the semiconductor substrate and which has a conductivity opposite to that of the semiconductor substrate. The first junction diode comprises the first well and a first conductive layer which is formed within the first well and which has of the same conductivity as that of the semiconductor substrate. The first conductive layer is connected electrically to the control gate.

The present invention also provides a method of fabricating a non-volatile semiconductor memory device comprising a semiconductor substrate and a memory element provided with a floating gate and a control gate, and the method has the steps described below.

This method includes the steps of: forming a first well in the semiconductor substrate; forming a second well within the first well, the second well having a conductivity opposite to that of the first well; forming a tunnel insulation film on the semiconductor substrate; forming a floating gate on the tunnel insulation film; and forming a dielectric film so as to cover the floating gate.

The method further includes the steps of: selectively removing the dielectric film to form a contact hole through which the second well is exposed; forming a conductive film that will become the control gate on the dielectric film, in such a manner that the conductive is in contact with the second well through the contact hole; and thermally processing the conductive film to diffuse impurities contained in the conductive film into the second well so as to form a first conductive layer.

With this aspect of the invention, the conductive film that will become the control gate is formed on the dielectric film, in such a manner that it is in contact with the second well through the contact hole, then the conductive film is thermally processed so that impurities within the conductive film are diffused into the second well so as to form the first conductive layer. This makes it possible to implement the third aspect (the extension of the control gate as far as above the control gate) of this non-volatile semiconductor memory device of the present invention.

The present invention also provides a method of fabricating a non-volatile semiconductor memory device comprising a semiconductor substrate and a memory element provided with a floating gate and a control gate, having the following steps:

The method includes the steps of: forming a first well in the semiconductor substrate; forming a second well within the first well, the second well having a conductivity opposite to that of the first well; forming a tunnel insulation film on the semiconductor substrate; forming a floating gate, a dielectric film, and a control gate in sequence above the semiconductor substrate; forming a first conductive layer in the second well; forming an interlayer dielectric film above the semiconductor substrate so as to cover the control gate and the first conductive layer; selectively removing the interlayer dielectric film to form a first contact hole through which the control gate is exposed, and a second contact hole through which the first conductive layer is exposed; and forming a wiring layer on the interlayer dielectric film, to electrically connect the control gate to the first conductive layer through the first and second contact holes. This makes it possible to implement the third aspect (the presence of the first and second contact holes) of this non-volatile semiconductor memory device.

Note that the first, second, and third conductive regions are regions that are formed by a method such as diffusion or ion implantation. The first and second conductive layers also have the same meaning. A memory element could be a memory transistor, by way of example.

DETAILED DESCRIPTION OF PREFERRED EMBODIMENTS

First Embodiment

Figure 1:
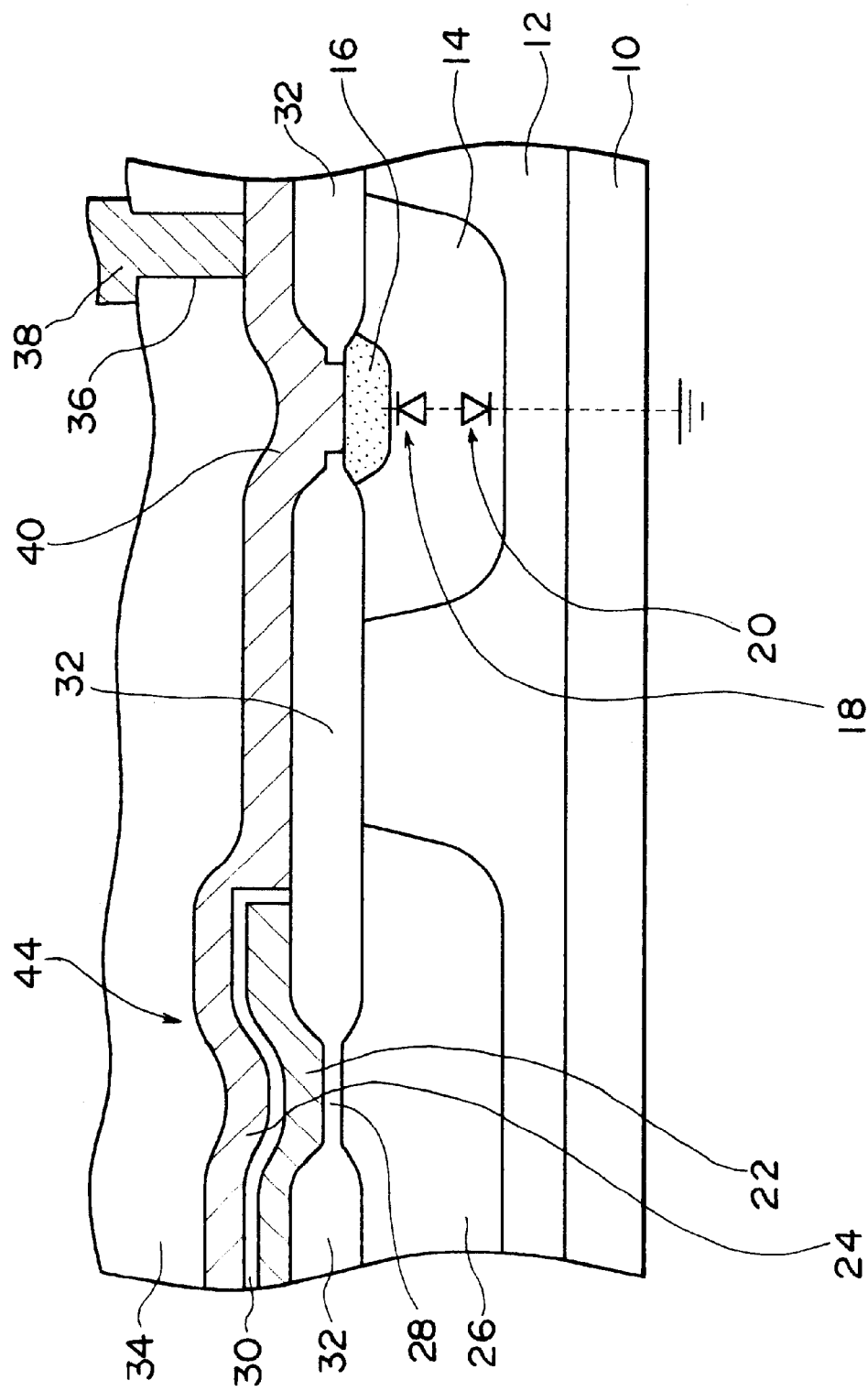
FIG. 1 is a cross-sectional view through the structure of a non-volatile semiconductor memory device, illustrating a first embodiment of the present invention.
Figure 2:
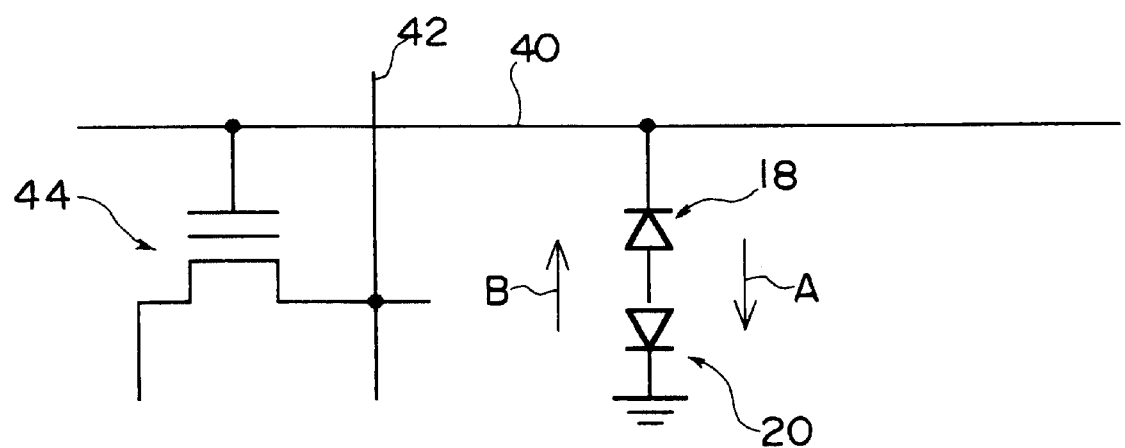
FIG. 2 is an equivalent circuit diagram of the non-volatile semiconductor memory device of FIG. 1.

A cross-sectional view through the structure of a non-volatile semiconductor memory device that is used to illustrate a first embodiment of the present invention is shown in FIG. 1, with an equivalent circuit diagram thereof being shown in FIG. 2.

An N-type well 12 is formed in a P-type semiconductor substrate 10. P-type wells 14 and 26 are formed at an interval apart in the N-type well 12. Field oxide films 32 are then formed at an interval apart on the main surface of the P-type semiconductor substrate 10. A tunnel oxide film 28 that is an example of a tunnel insulation film is formed within a region defined by the field oxide films 32 over the P-type well 26. A floating gate 22 is formed on the tunnel oxide film 28. An insulation film 30 that functions as a dielectric film is formed on the floating gate 22. A control gate 24 is then formed over the P-type semiconductor substrate 10 so as to cover the insulation film 30. A memory transistor 44 is comprised of the tunnel oxide film 28, the floating gate 22, the insulation film 30, and the control gate 24.

An N$^+$-type diffusion layer 16 is formed within the P-type well 14. The control gate 24 extends as far as above the N$^+$-type diffusion layer 16, and this portion forms a wordline 40. The control gate 24 and the N$^+$-type diffusion layer 16 are electrically connected.

A first junction diode 18 is formed of the N$^+$-type diffusion layer 16 and the P-type well 14 and a second junction diode 20 is formed of the P-type well 14 and the N-type well 12.

A interlayer dielectric film 34 is formed on the control gate 24. Wire 38 of aluminum or an aluminum alloy is formed on top of the interlayer dielectric film 34, and the wire 38 and the wordline 40 are connected electrically through a contact hole 36 formed in the interlayer dielectric film 34.

As shown in FIG. 2, a bitline 42 is connected electrically to the drain region of the memory transistor 44. The wordline 40 is connected electrically to the control gate of the memory transistor 44, and the wordline 40 is also connected electrically to the circuit formed of the first junction diode 18 and the second junction diode 20.

When the memory transistor is operated by applying a voltage of, for example, ±8 volts to the control gate, how this circuit functions is described below. Referring to FIGS. 1 and 2, when a positive voltage is applied, a reverse voltage is applied to the first junction diode 18. The junction breakdown between the N$^+$-type diffusion layer 16 and the P-type well 14 is set to ensure that no current passes through the first junction diode 18 when this voltage is +8 volts or less. This is because +8 volts is applied to the control gate 24 to activate the memory transistor 44 which means that, if a current were to flow within the first junction diode 18 at that point, that current will flow through the second junction diode 20 to ground, which will make the voltage of the control gate 24 drop and it will no longer be possible to activate the memory transistor 44. Note that the junction breakdown is mainly determined by the impurity densities in the N$^+$-type diffusion layer 16 and the P-type well 14.

When a charge accumulates at the control gate 24 because of the charging phenomenon, so that a voltage of greater than 8 volts is applied to the control gate 24, a current flows in the direction indicated by A through the circuit consisting of the wordline 40, the first junction diode 18, and the second junction diode 20, to ground. This application of a voltage greater than 8 volts to the control gate 24 makes it possible to prevent a phenomenon such that the charge passes through the tunnel oxide film 28, damaging the tunnel oxide film 28.

When a negative voltage is applied, a reverse voltage is applied to the second junction diode 20. The junction breakdown of the P-type well 14 and the N-type well 12 is set to ensure that no current flows through the second junction diode 20 when a negative voltage with an absolute value of 8 volts or less is applied. The reason for this setting is described as follows: memory transistor 44 is activated by applying −8 volts to the control gate 24; at this time, when a current were to flow within the second junction diode 20 at that point, that current will flow in the direction indicated by B through the circuit consisting of the second junction diode 20, the first junction diode 18, and the wordline 40; this will make the voltage of the control gate 24 drop and it will no longer be possible to activate the memory transistor 44. The junction breakdown of the second junction diode 20 is mainly determined by the impurity densities in the P-type well 14 and the N-type well 12. When a charge accumulates at the control gate 24 because of the charging phenomenon, so that a negative voltage with an absolute voltage of greater than 8 volts, such as −10 volts, is applied to the control gate 24, a current will flow in the direction indicated by B, so that the voltage of the control gate 24 can be allowed to fall. This application of a voltage with an absolute value of greater than 8 volts to the control gate 24 makes it possible to prevent the phenomenon such that the charge passes through the tunnel oxide film 28, damaging the tunnel oxide film 28.

Therefore, this first embodiment of the invention makes it possible to protect the tunnel insulation film effectively from the charging phenomenon, in a non-volatile semiconductor memory device that uses positive and negative voltages applied to a control gate, to activate a memory element.

When a MOS capacitor is used as a protective circuit, the charge would damage the dielectric film and the protective circuit function is impaired. However, the use of junction diodes in this first embodiment of the invention ensures that there is no need for such a dielectric film in the junction diodes, and thus this problem does not arise.

Second Embodiment

Figure 3:
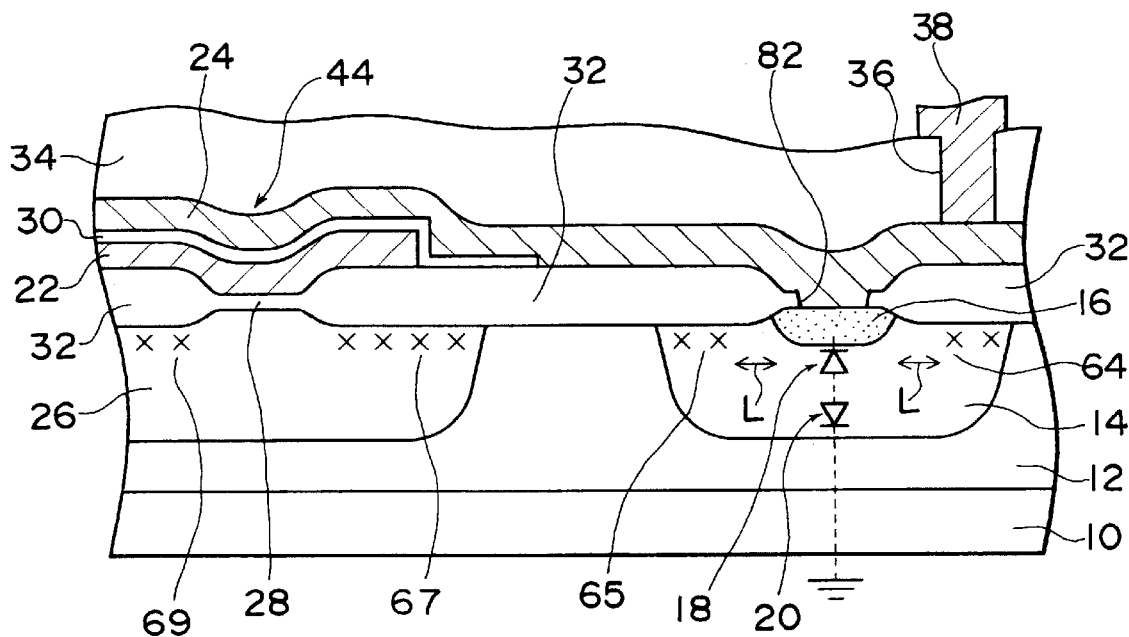
FIG. 3 is a cross-sectional view through the structure of a second embodiment of the non-volatile semiconductor memory device of the present invention.
Figure 4:
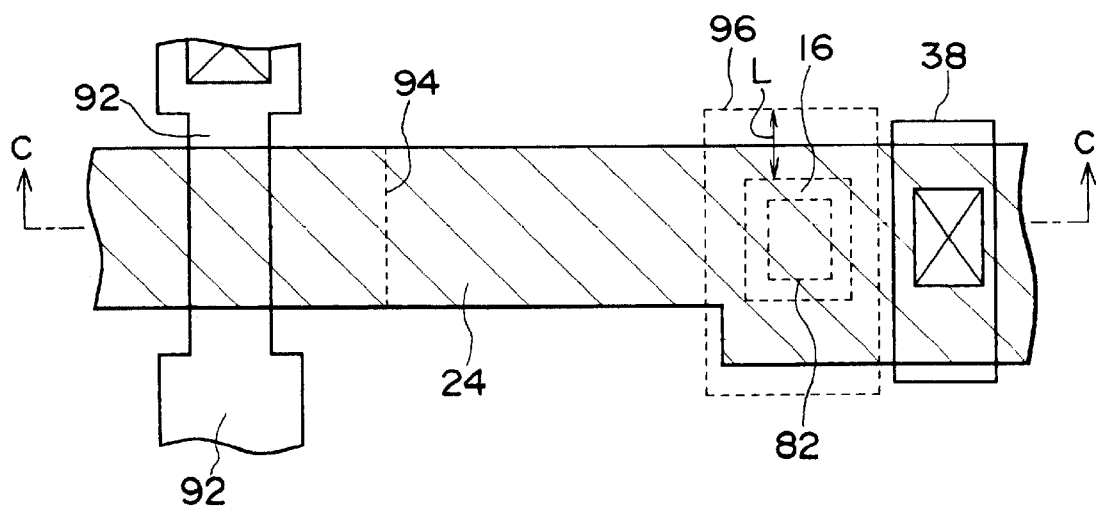
FIG. 4 is a plan view of the non-volatile semiconductor memory device of FIG. 3.

The description now turns to a second embodiment of the present invention. A cross-sectional view of the structure of the second embodiment of the non-volatile semiconductor memory device of the present invention is shown in FIG. 3, and a plan view thereof is shown in FIG. 4. A section taken along the line C—C of FIG. 4 is equivalent to the cross-sectional view of FIG. 3. Components that are the same as those in the configuration shown in FIG. 1 are given the same reference numbers and further description thereof is omitted.

Channel stopper regions 64 and 65 are formed within the P-type well 14. The channel stopper region 64 and the N$^+$-type diffusion layer 16 are formed in such a manner that an interval L is provided therebetween. The reason for the provision of the interval L is not to cause breakdown of the channel stopper region 64 and the N$^+$-type diffusion layer 16 when a programming voltage, read voltage, or erasure voltage is applied to the control gate 24. This interval L is 0.3 to 0.8 μm. The channel stopper region 65 and the N$^+$-type diffusion layer 16 are formed in such a manner that the interval L is provided therebetween, for the same reason above. A contact hole 82 is formed on the N$^+$-type diffusion layer 16. The control gate 24 extends as far as above the N$^+$-type diffusion layer 16. And the control gate 24 and the N$^+$-type diffusion layer 16 are in electrical contact through the contact hole 82. Note that reference numbers 67 and 69 in this figure also denote channel stopper regions.

Referring to FIG. 4, the control gate 24 is formed in a lateral direction. A floating gate is formed below control gate 24. Reference number 94 denotes an edge portion of this floating gate. A source/drain region 92 is formed below the floating gate, in the longitudinal direction so as to cross the control gate 24.

The control gate 24 extends as far as above the N$^+$-type diffusion layer 16. And the control gate 24 and the N$^+$-type diffusion layer 16 are in electrical contact through the contact hole 82. Reference number 96 denotes the boundary between the channel stopper regions 64 and 65 and the P-type well 14.

The description now turns to a method of fabricating the second embodiment of the non-volatile semiconductor memory device of the present invention, with reference to FIGS. 3 and 5 to 12.

Figure 5:
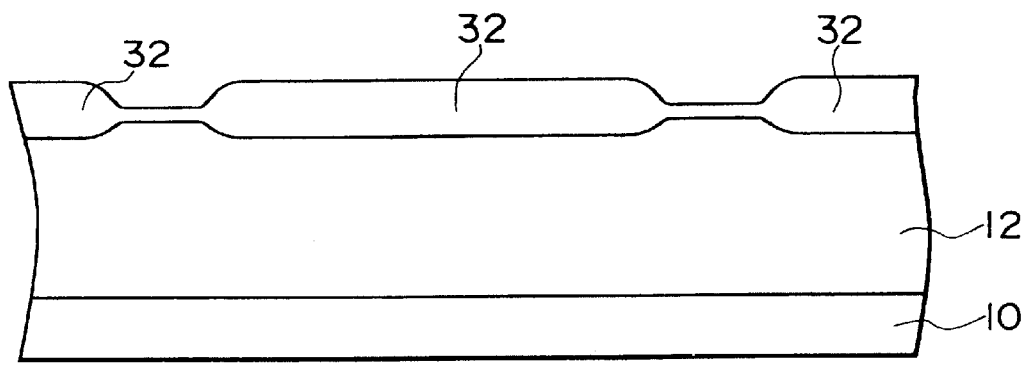
FIG. 5 is a cross-sectional view illustrating a first step in the fabrication of the second embodiment of the non-volatile semiconductor memory device of the present invention.

Referring first to FIG. 5, the field oxide films 32 are formed at an interval above the P-type semiconductor substrate 10. Phosphorus is then implanted into the P-type semiconductor substrate 10 under conditions of an accelerating voltage of 1.5 to 3.0 MeV and a dosage of $1.0\times10^{13}$ to $3.0\times10^{13}/cm^2$. The N-type well 12 is thereby formed to a depth of 1.5 to 3.0 μm, with an impurity density of $5.0\times10^{16}$ to $5.0\times10^{17}/cm^3$. Arsenic could be used instead of phosphorus.

Figure 6:
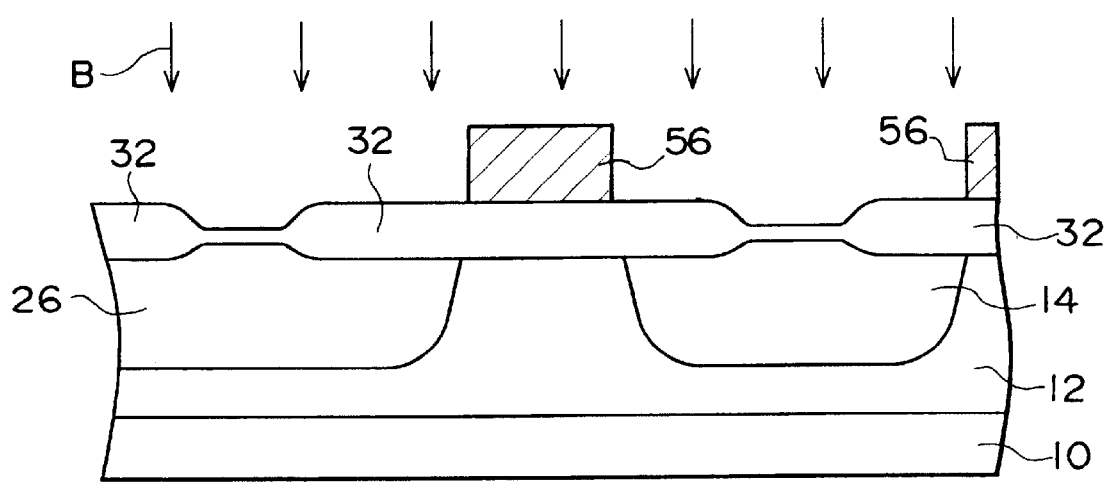
FIG. 6 is a cross-sectional view illustrating a second step in the fabrication of the second embodiment of the non-volatile semiconductor memory device of the present invention.

Referring to FIG. 6, resist 56 is then formed on the P-type semiconductor substrate 10 and is subjected to predetermined patterning. Using the resist 56 as a mask, boron ions at a dosage of $1.0\times10^{13}$ to $3.0\times10^{13}/cm^2$ are implanted into the N-type well 12 with an accelerating voltage of 0.5 to 1.2 MeV, to form the P-type wells 14 and 26 to a depth of 1.0 to 2.0 μm, with an impurity density of $5.0\times10^{16}$ to $5.0\times10^{17}/cm^3$.

Figure 7:
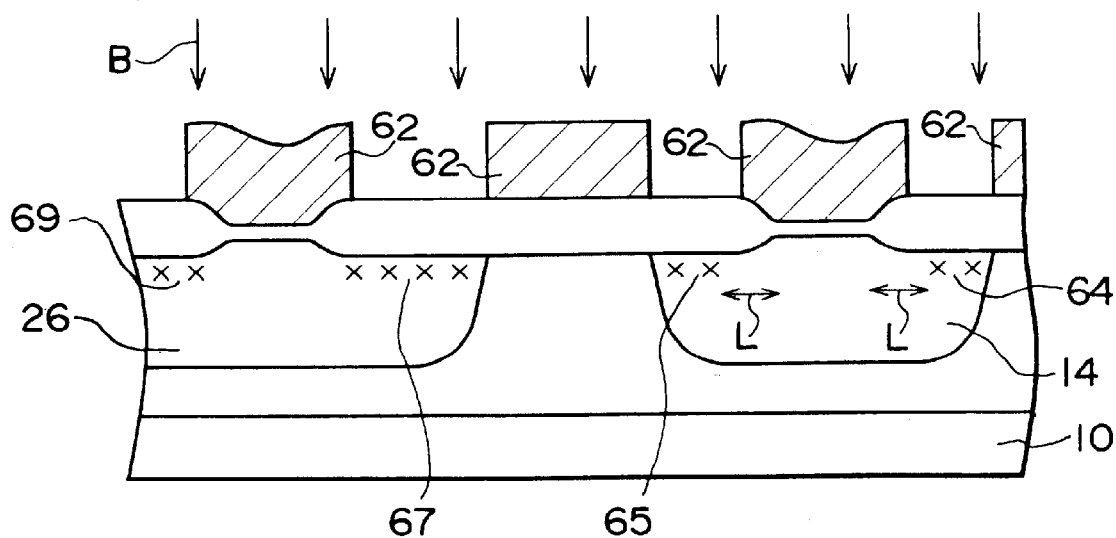
FIG. 7 is a cross-sectional view illustrating a third step in the fabrication of the second embodiment of the non-volatile semiconductor memory device of the present invention.

Referring to FIG. 7, resist 62 is formed on the P-type semiconductor substrate 10 and is subjected to predetermined patterning. Using the resist 62 as a mask, boron ions at a dosage of $1.0\times10^{12}$ to $1.0\times10^{13}/cm^2$ are implanted into the P-type wells 14 and 26 with an accelerating voltage of 100 to 200 keV, to form the channel stopper regions 64, 65, 67, and 69 to a depth of 0.2 to 0.5 μm with an impurity density of $1.0\times10^{17}$ to $1.0\times10^{18}/cm^3$. The resist 62 is patterned in such a manner that the interval between the channel stopper region 64 and the N$^+$-type diffusion layer 16 of FIG. 3 and the interval between the channel stopper region 65 and the N$^+$-type diffusion layer 16 will each be L.

Figure 8:
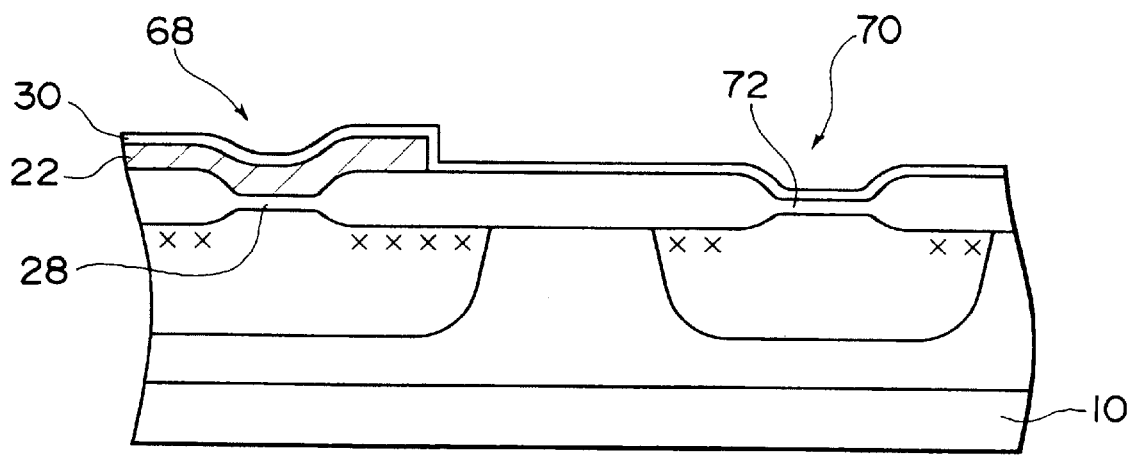
FIG. 8 is a cross-sectional view illustrating a fourth step in the fabrication of the second embodiment of the non-volatile semiconductor memory device of the present invention.

Referring to FIG. 8, after the oxide film has been removed from on top of the element formation region, the P-type semiconductor substrate 10 is thermally oxidized to simultaneously form the tunnel oxide film 28 in a memory cell formation region 68, and an insulation film 72 in a junction diode formation region 70. The tunnel oxide film 28 is formed of a silicon oxide film or the like having a predetermined thickness and the insulation film 72 is formed of a silicon oxide film or the like.

A polycrystalline silicon film is then formed on top of the P-type semiconductor substrate 10, and this film is then doped with phosphorus to make it N-type. Resist that has been subjected to predetermined patterning is used as a mask to etch the polycrystalline silicon film, to form the floating gate 22 of a predetermined shape. The insulation film 30, which is an ONO film consisting of a stack of a silicon oxide film, a silicon nitride film, and another silicon oxide film is then formed over the P-type semiconductor substrate 10 in such a manner that it covers the floating gate 22.

Figure 9:
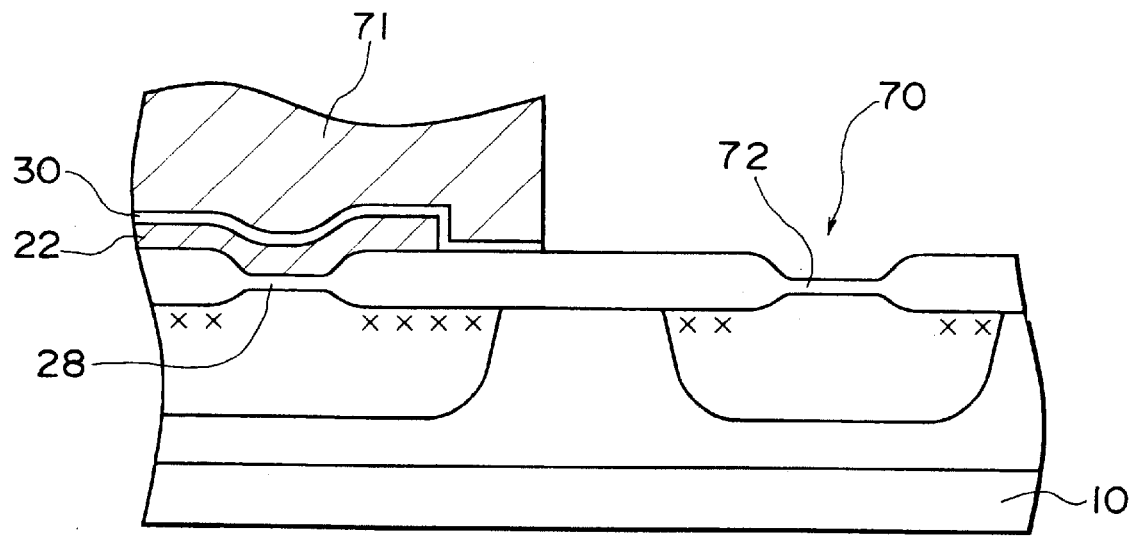
FIG. 9 is a cross-sectional view illustrating a fifth step in the fabrication of the second embodiment of the non-volatile semiconductor memory device of the present invention.

Referring to FIG. 9, resist 71 is formed on top of the insulation film 30, then the insulation film 30 is removed from the entire area apart from the area above the floating gate 22.

Figure 10:
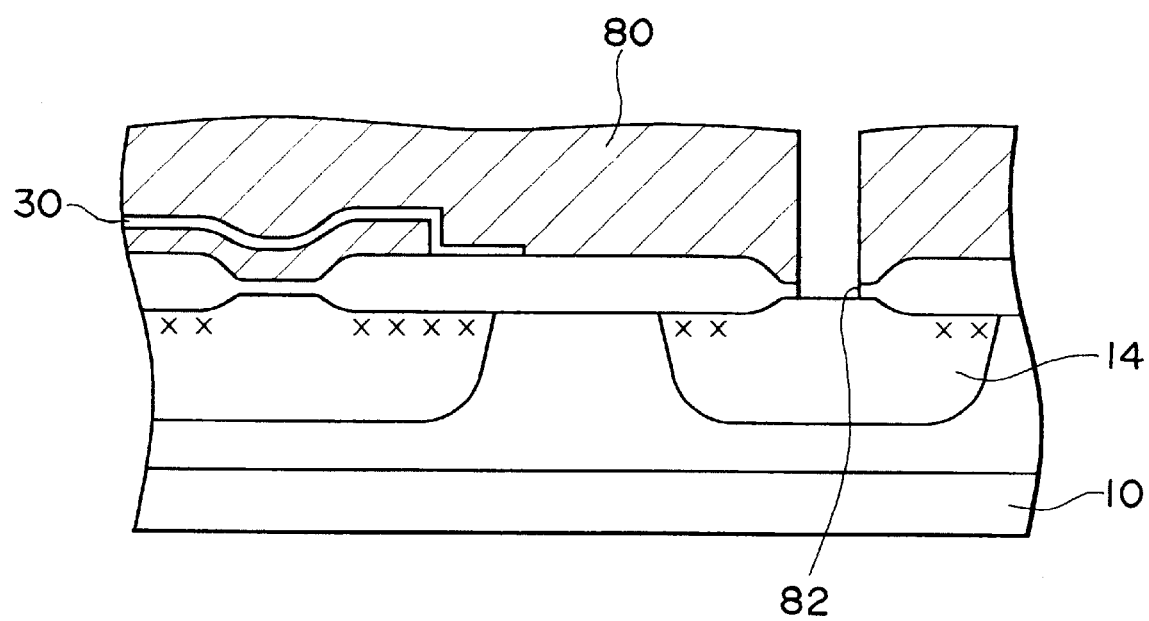
FIG. 10 is a cross-sectional view illustrating a sixth step in the fabrication of the second embodiment of the non-volatile semiconductor memory device of the present invention.

Referring to FIG. 10, resist 80 is formed over the P-type semiconductor substrate 10 and is subjected to predetermined patterning. Using the resist 80 as a mask, the insulation film 72 is etched away to form the contact hole 82 through which part of the P-type well 14 is exposed.

Figure 11:
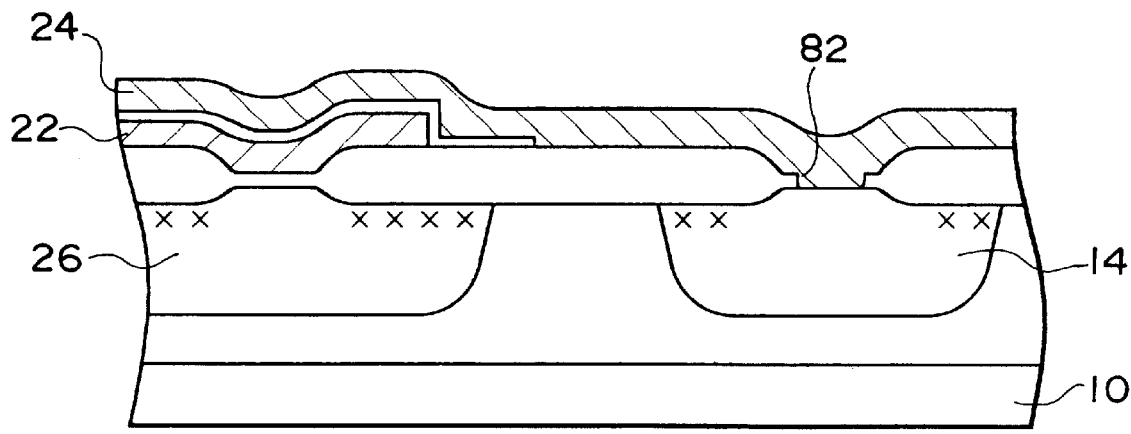
FIG. 11 is a cross-sectional view illustrating a seventh step in the fabrication of the second embodiment of the non-volatile semiconductor memory device of the present invention.

Referring to FIG. 11, a polycrystalline silicon film for forming the control gate 24 is formed on top of the P-type semiconductor substrate 10 so as to cover the floating gate 22. This polycrystalline silicon film is in electrical contact with the P-type well 14 through the contact hole 82. The polycrystalline lo silicon film is then doped with phosphorus or arsenic to make it N-type, and is used, as a resist mask of a predetermined pattern, for etching to form the control gate 24.

Figure 12:
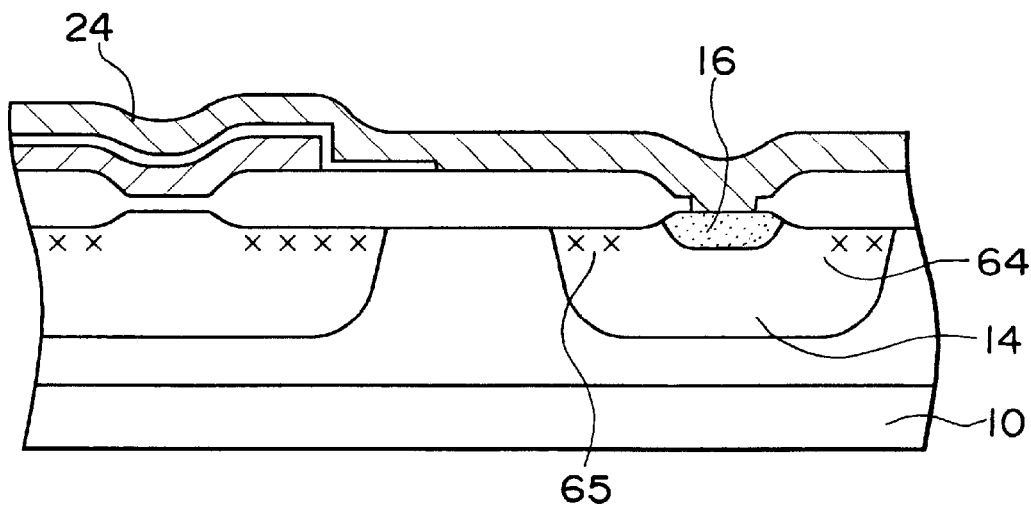
FIG. 12 is a cross-sectional view illustrating an eighth step in the fabrication of the second embodiment of the non-volatile semiconductor memory device of the present invention.

Referring to FIG. 12, the P-type semiconductor substrate 10 is thermally processed so that the phosphorous comprised within control gate 24 is diffused on the upper portion of the P-type well 14 to form the N$^+$-type diffusion layer 16 at an impurity density of $1.0\times10^{20}$ to $1.0\times10^{21}/cm^3$. Arsenic could be used instead of phosphorus.

Referring back to FIG. 3, the interlayer dielectric film 34 is formed so as to cover the control gate 24. The wire 38 of aluminum or an aluminum alloy that has been subjected to predetermined patterning is then formed on the interlayer dielectric film 34.

The reasons why the impurity density of the N-type well 12 is set to $5.0\times10^{16}$ to $5.0\times10^{17}/cm^3$, the density of the P-type well 14 is set to $5.0\times10^{16}$ to $5.0\times10^{17}/cm^3$, and the density of the N$^+$-type diffusion layer 16 is set to $1.0\times10^{20}$ to $1.0\times10^{21}/cm^3$ will be discussed below.

In the present embodiment, the memory transistor 44 is activated by applying a voltage of ±8 volts to the control gate 24. The junction breakdown between the N$^+$-type diffusion layer 16 and the P-type well 14 must be set in such a manner that no current is conducted through the first junction diode 18 consist of the N$^+$-type diffusion layer 16 and the P-type well 14 when the voltage of +8 volts is applied to the control gate 24. The junction breakdown is mainly determined by the impurity densities of the N$^+$-type diffusion layer 16 and the P-type well 14. That is why the impurity densities in the N$^+$-type diffusion layer 16 and the P-type well 14 are set as specified previously. When the charging phenomenon causes a voltage greater than +8 volts to be applied to the control gate 24, this setting of the densities ensures that a current is guided through the first junction diode 18 to protect the tunnel oxide film 28 from the charging phenomenon.

Similarly, the junction breakdown between the P-type well 14 and the N-type well 12 is set to ensure that no current is conducted through the second junction diode 20 formed of the P-type well 14 and the N-type well 12 when the memory transistor 44 is activated by applying a voltage of −8 volts to the control gate 24. The densities of the P-type well 14 and the N-type well 12 are set according to the same reason as described above.

Third Embodiment

Figure 13:
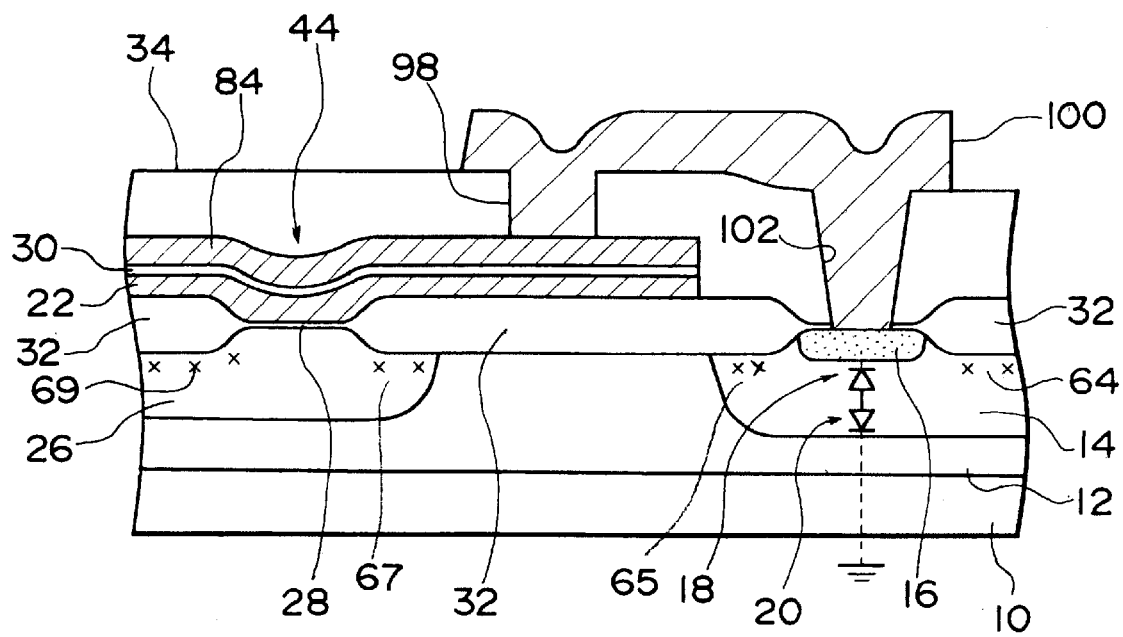
FIG. 13 is a cross-sectional view through the structure of a third embodiment of the non-volatile semiconductor memory device of the present invention.
Figure 14:
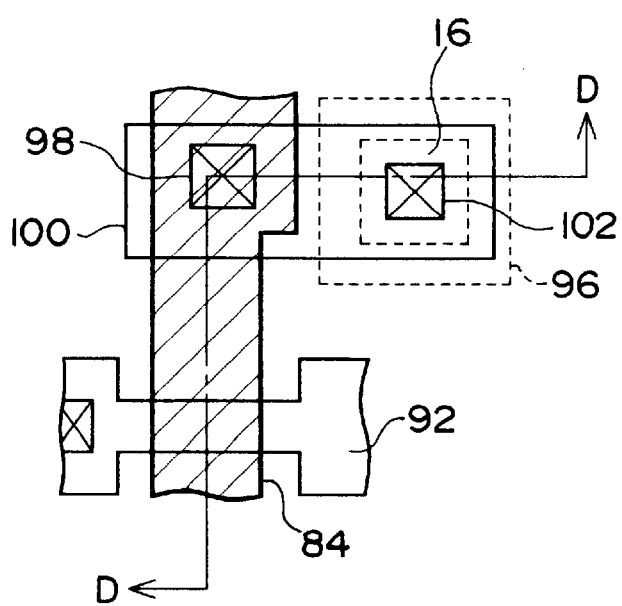
FIG. 14 is a plan view of the non-volatile semiconductor memory device shown in FIG. 13.

The description now concerns a third embodiment of the non-volatile semiconductor memory device of the present invention. A cross-sectional view through the structure of the third embodiment of the non-volatile semiconductor memory device of the present invention is shown in FIG. 13, and a plan view thereof is shown in FIG. 14. A section taken along the line D—D of FIG. 14 is equivalent to the cross-sectional view of FIG. 13.

The structure of the third embodiment of the non-volatile semiconductor memory device of the present invention will now be described with reference to FIGS. 13 and 14. Note that components that are the same as those in the cross-sectional view of the first embodiment of the non-volatile semiconductor memory device of the present invention, shown in FIG. 1, are given the same reference numbers and further description thereof is omitted.

A control gate 84 does not extend on the $N^+$-type diffusion layer 16, and the edges thereof are positioned above the field oxide film 32. Within the interlayer dielectric film 34 is formed a contact hole 98 through which is exposed the control gate 84 and a contact hole 102 through which is exposed the $N^+$-type diffusion layer 16. Wire 100 of aluminum or an aluminum alloy is formed on the interlayer dielectric film 34. The wire 100 is in electrical contact with the control gate 84 through the contact hole 98 and with the $N^+$-type diffusion layer 16 through the contact hole 102.

Figure 21:
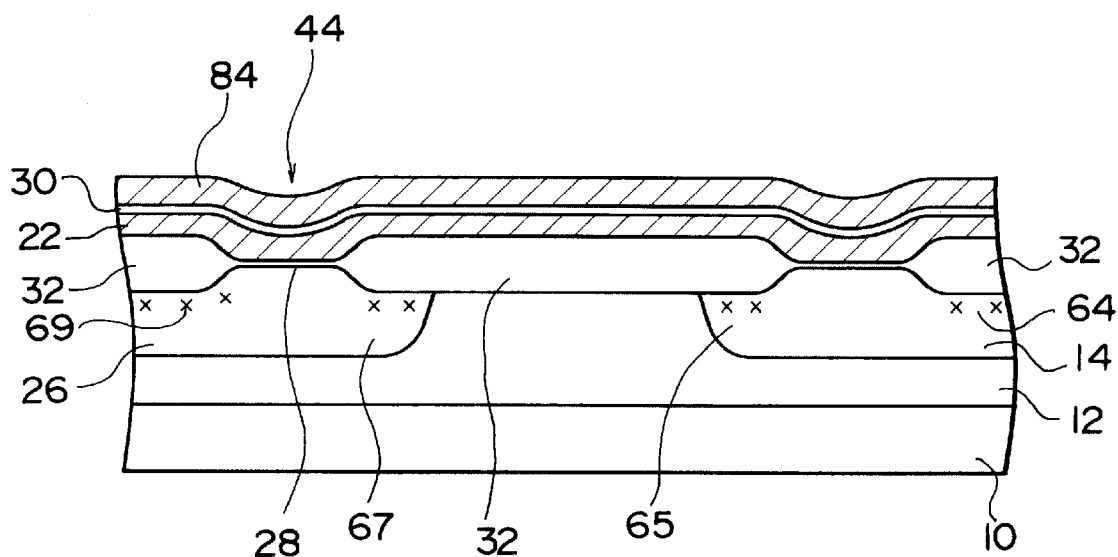
FIG. 21 is a cross-sectional view illustrating a first step in the fabrication of the third embodiment of the non-volatile semiconductor memory device of the present invention

The configuration of this third embodiment of the invention can be fabricated as described below. The steps shown in FIGS. 5 to 7 are firstly performed. Referring now to FIG. 21, the tunnel oxide film 28 is formed over of the semiconductor substrate 10, then a film that will become the floating gate 22, a film that will become the insulation film 30, and a film that will become the control gate 84 are then formed in sequence over the tunnel oxide film 28.

Figure 22:
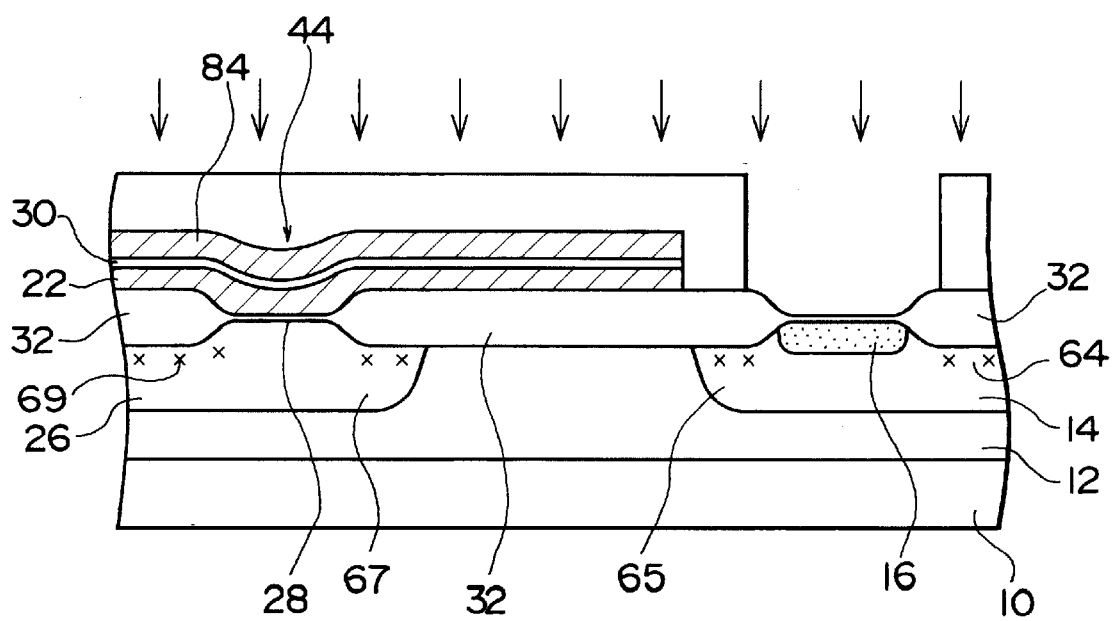
FIG. 22 is a cross-sectional view illustrating a second step in the fabrication of the third embodiment of the non-volatile semiconductor memory device of the present invention.

Referring to FIG. 22, the film that will become the floating gate 22, the film that will become the insulation film 30, and the film that will become the control gate 84 are then removed from a portion above the P-type well 14. The $N^+$-type diffusion layer 16 is formed by a method such as ion implantation into the P-type well 14, using resist as a mask.

Figure 23:
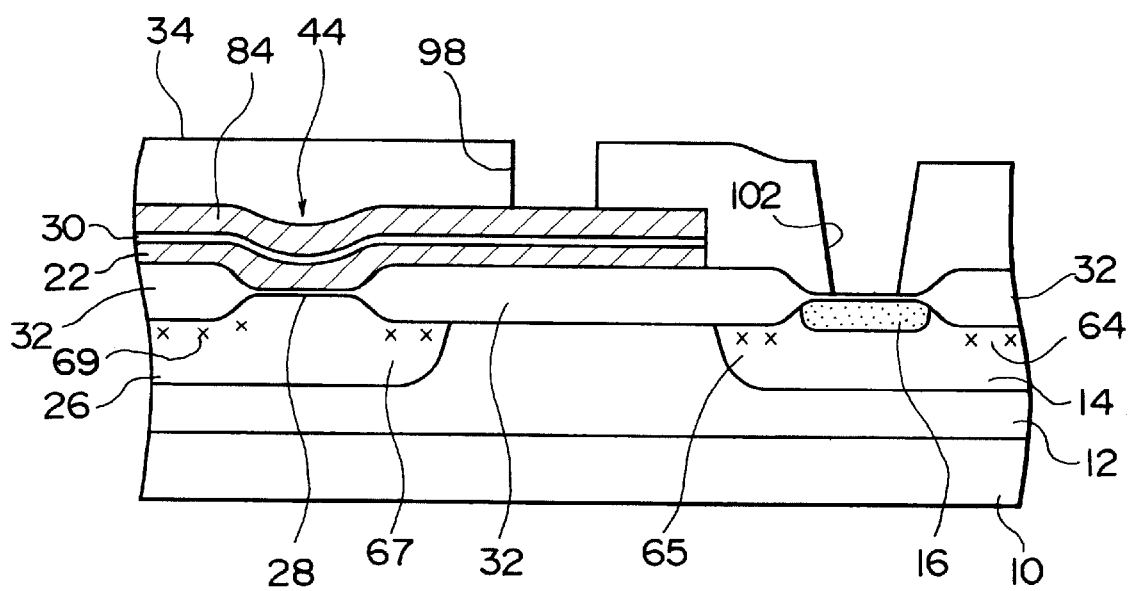
FIG. 23 is a cross-sectional view illustrating a third step in the fabrication of the third embodiment of the non-volatile semiconductor memory device of the present invention.
Figure 24:
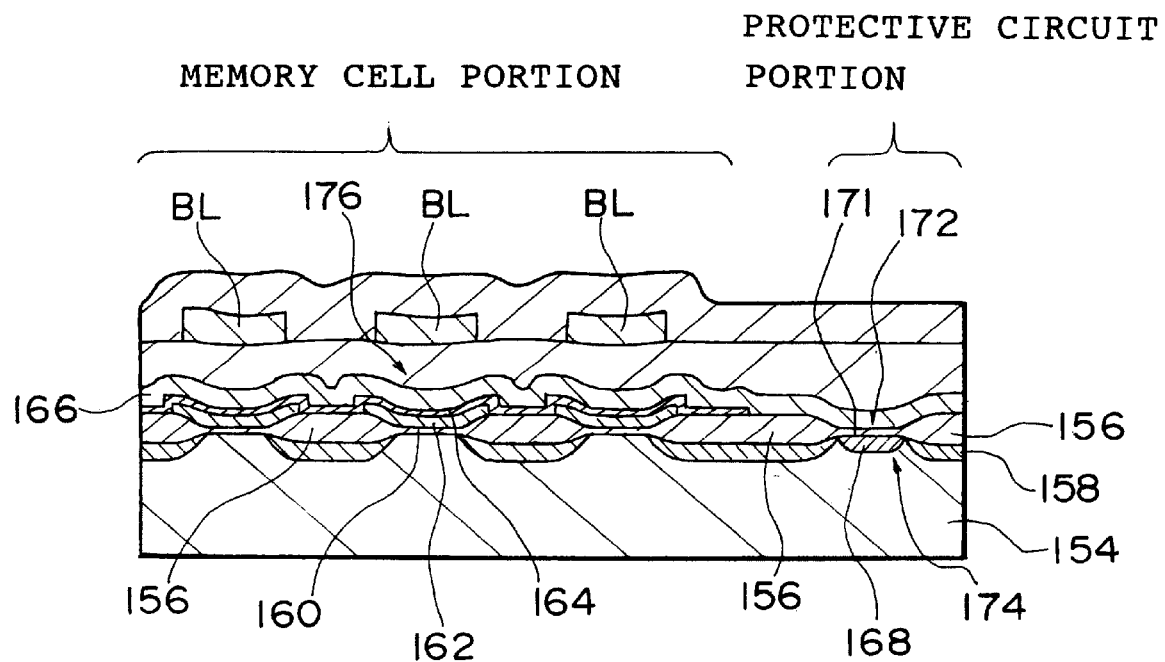
FIG. 24 is a cross-sectional view of an example of a conventional non-volatile semiconductor memory device.
Figure 25:
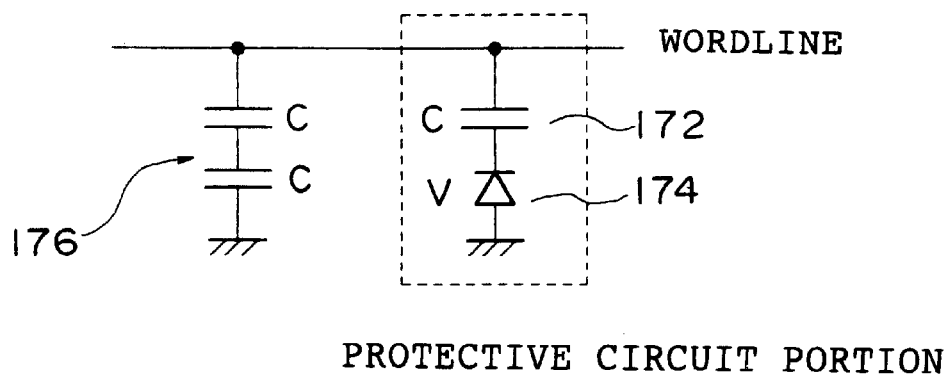
FIG. 25 is an equivalent circuit diagram of the non-volatile semiconductor memory device of FIG. 24.

Referring to FIG. 23, the interlayer dielectric film 34 is formed over the semiconductor substrate 10 so as to cover the control gate 84 and the $N^+$-type diffusion layer 16, then the interlayer dielectric film 34 is selectively removed to form the first contact hole 98 through which the control gate 84 is exposed and the second contact hole 102 through which the $N^+$-type diffusion layer 16 is exposed.

Referring to FIG. 13, the wire 100 is formed on the interlayer dielectric film 34, to electrically connect the control gate 84 with the $N^+$-type diffusion layer 16 through the first and second contact holes 98 and 102. The impurity densities and depths of each of the N-type well 12, the P-type wells 14 and 26, and the $N^+$-type diffusion layer 16 are similar to those of the second embodiment In this third embodiment of the invention, the aluminum or aluminum alloy wire 100 is formed on the interlayer dielectric film 34 that has the first contact hole 98 through which the control gate 84 is exposed and the second contact hole 102 through which the $N^+$-type diffusion layer 16 is exposed, so that this aluminum wire 100 electrically connect the control gate 84 with the $N^+$-type diffusion layer 16. Since this connection step can be performed at the same time as the step of connecting other wiring layers, it makes it unnecessary to have a separate step for connecting the control gate 84 with the $N^+$-type diffusion layer 16, and thus it simplifies the process of fabricating the non-volatile semiconductor memory device.

Fourth Embodiment

Figure 15:
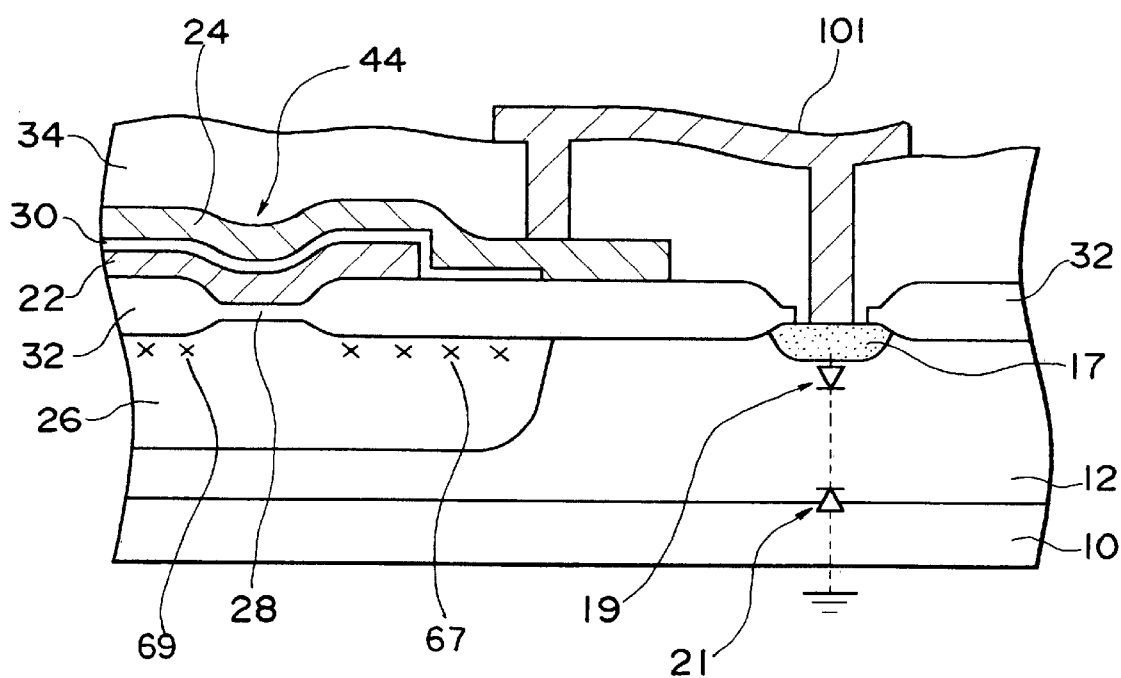
FIG. 15 is a cross-sectional view through the structure of a fourth embodiment of the non-volatile semiconductor memory device of the present invention.

The description now turns to a fourth embodiment of the present invention. A cross-sectional view through the structure of a non-volatile semiconductor memory device in accordance with this fourth embodiment of the invention is shown in FIG. 15. Components that are the same as those in the configuration shown in FIG. 1 are given the same reference numbers and further description thereof is omitted. The fourth embodiment is characterized in the provision of a $P^+$-type diffusion layer 17 instead of the $N^+$-type diffusion layer 16. A first junction diode 19 is formed of the $P^+$-type diffusion layer 17 and the N-type well 12, and a second junction diode 21 is formed of the N-type well 12 and the P-type semiconductor substrate 10. The operating principle of the circuit consisting of the first junction diode 19 and the second junction diode 21 is the same as that of the circuit in the first embodiment, consisting of the first junction diode 18 and the second junction diode 20. This fourth embodiment makes the P-type well 14 of the first or second embodiment unnecessary. This means that it is not necessary to provide any interval between the P-type well 26 and 14, the area occupied by the protective element can be reduced, and also higher density and larger integration of the element can be achieved.

Note that the control gate 24 does not extend as far as above the $P^+$-type diffusion layer 17, and electrical contact between the control gate 24 and the $P^+$-type diffusion layer 17 is provided by wire 101 of aluminum or an aluminum alloy that is formed on top of the interlayer dielectric film 34.

Fifth Embodiment

Figure 16:
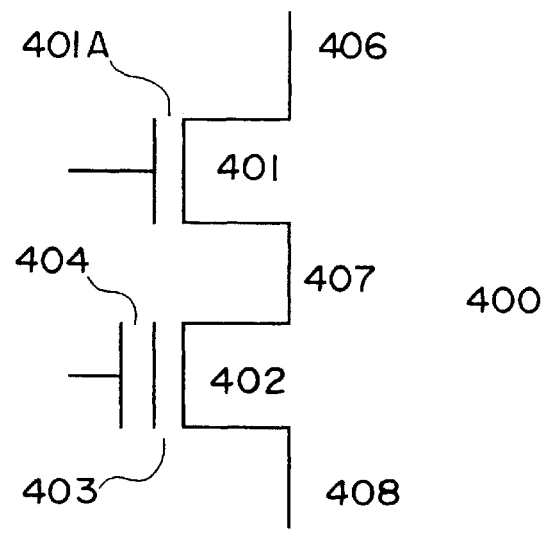
FIG. 16 is a schematic view of a memory cell used in a fifth embodiment of the non-volatile semiconductor memory device of the present invention.

A fifth embodiment of the present invention is an application of the present invention to a non-volatile semiconductor memory device, which is provided with a plurality of memory elements and a plurality of access transistors for activating the memory elements selectively, in such a manner that each access transistor selectively activates only one memory element. FIG. 16 is a schematic view of a memory cell 400 of a flash memory cell. The memory cell 400 has an access transistor 401 and a memory transistor 402 that is the memory element. The access transistor 401 has a gate 401A, whereas the memory transistor 402 has a floating gate 403 and a control gate 404. The access transistor 401 is an N-channel MOSFET with a threshold voltage of approximately 0.7 volts.

Programming of the memory cell 400 by channel hot electron is achieved by simultaneously applying a high positive programming voltage Vpp, 5 to 12 volts for example, to the gate 401A of the access transistor 401 and, 12 volts for example, to the control gate 404 of the memory transistor 402, while holding a source 408 of the memory transistor 402 at a ground potential Vss, and applying a positive programming pulse to a drain 406 of the access transistor 401. For example, a programming pulse of about 5 volts could be applied for 100 microseconds. Referring to FIG. 16, a drain 407 of the memory transistor 402 (which is also the source of the access transistor 401) is formed by high-density doping 510 to the substrate. This ion implantation to the drain enhances the electric field in the area of a channel region 511 adjacent to the drain 407, thereby accelerating the electrons and generating a distribution of high energy electrons that are energetic enough to overcome the potential energy barrier for transfer over a thin tunnel film and into the floating gate 403 (i.e. hot electron injection). This highly doped drain implantation improves the speed of programming by an order of magnitude. Note that the access transistor 401 uses a smaller fraction of the applied drain pulse voltage, since the width of the access transistor 401 is typically within the range of 1.0 to 5.0 $\mu$m, compared with the 0.25 to 1.5 $\mu$m of the memory transistor 402.

Erasing of the memory cell 400 is achieved by applying 5 volts to the source 408 of the memory transistor 402, while holding the control gate 404 at −7 volts. A high electric field is generated in a tunnel oxide film 405 (shown in FIG. 17), thereby allowing the electrons that have been collected in the floating gate 403 to overcome the potential energy barrier and pass (by Fowler-Nordheim tunneling, for example) through the tunnel oxide film 405 to transfer to the source 408 of the memory transistor 402. During the erasing, the gate 401A is held at a voltage of 5 to 12 volts and the drain 406 is left floating.

The source 408 of the memory transistor 402 is also formed by high-density doping 512 of the substrate. This high-density doping increases the dielectric breakdown of the junction, thereby significantly accelerating the transfer of electrons from the floating gate during the erasure. In this manner, the memory transistor 402 erases during the erasure operation to the point at which its threshold voltage is negative. Thus the memory transistor 402 cannot be turned off by the control gate 404.However, the access transistor 401 prevents this overerasure from affecting cell performance. More specifically, the access transistor 401 is not controlled by the state of the floating gate, so the threshold voltage of the access transistor 401 remains at approximately 0.7 volts.

Various other operating conditions could be set, not only for the above described programming and erasure operations. The conditions described below could also be set for Fowler-Nordheim tunneling, such as during programming or erasure. Programming conditions could be: −8 volts at the control gate, the source floating, 8 volts at the drain, and 8 volts at the gate of the access transistor. Erasure conditions could be: 8 volts at the control gate, −8 volts at the source, the drain floating, and 8 volts at the gate of the access transistor.

Figure 18:
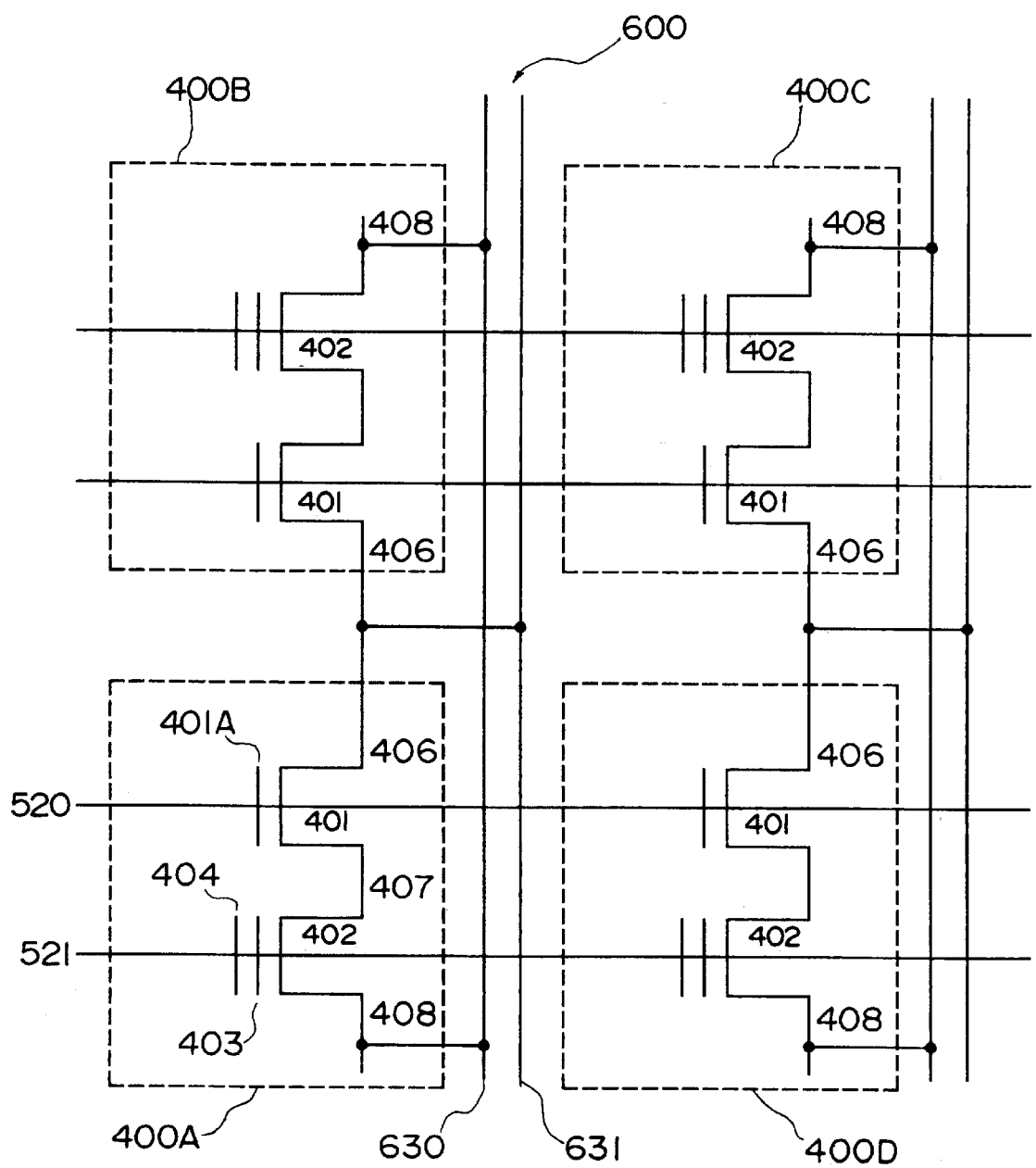
FIG. 18 is a schematic view of a memory cell array configured of the memory cells of FIG. 16.

A schematic view of a memory array 600 which comprises memory cells 400A to 400D is shown in FIG. 18. Each of these memory cells is identical to the memory cell 400. The drains 406 of the access transistors 401 of the cells 400A and 400B are coupled to a metal drain bitline 631, and the sources 408 of the memory transistors 402 of these cells 400A and 400B are coupled to a metal source bitline 630. The gates 401A of the access transistors 401 of the memory cells 400A and 400D are coupled to a wordline 520, and the control gates 404 of the memory cells 400A and 400D are coupled to a control line 521.

Referring to FIG. 18, the reading of these memory cells 400, such as the memory cell 400A, is accomplished by applying a standard voltage Vcc (typically 5 volts) to the gate 401A via the wordline 520 and the control gate 404 via the control line 521, while simultaneously sensing the read current flowing through the memory cell 400A by a conventional sense amplifier (not shown in the figure) that is connected to the drain bitline 631. If the memory cell 400A has been erased (i.e., if there is a zero charge or net positive charge on the floating gate 403), both the access transistor 401 and the memory transistor 402 are turned on, allowing a current to flow through the memory cell 400A that can be sensed by the sense amplifier. If the memory cell 400A is programmed (i.e., if there a net negative charge on the floating gate 403), the threshold voltage of the memory transistor 402 rises above the supply voltage Vcc, preventing current from flowing though the memory cell 400A.

In this configuration, the sense amplifier which receives the voltage on the drain bitline generates a feedback voltage to be supplied on the source bitline 630, and thereby increasing the voltage on the source bitline 630 during a read operation. This slows down the voltage drop on the drain bitline 631. Thus, the present invention significantly reduces the time required for the bitlines to recover their original state in comparison with prior-art memory cell arrays, so that they can perform sensing during the next logic state cycle.

The main limitation to scaling of the memory transistor 402 is the punch-through requirement. Capacitive coupling between the drain 407 and the floating gate 403 causes the memory transistor 402 to be turned on by the coupling to the drain 407, typically. This capacitive coupling limits the scalability of the channel length region 511 (see FIG. 17) and disadvantageously, this limits the improvement in programming speed that is necessary for 5-volt programming capability. More specifically, capacitive coupling from the drain 407 to the floating gate 403 degrades the punch-through margin of the memory transistor 402, and limits the capability of the memory transistor 402 to handle the drain voltage. The capacitive coupling effect does not scale with the gate line width of the memory transistor 402 because of the strong effect of fringing capacitance, which is the capacitance other than parallel-plate capacitance. Therefore, the effect of this drain coupling becomes more dominant in accordance with geometries becomes smaller, and it poses a serious limitation to the scaling of conventional EPROM and flash cells that do not have access gates. Note that the programming speed increases exponentially with the inverse of the effective channel length.

The memory cell of the present invention solves this scaling problem by the inclusion of the access transistor 401 within the memory cell 400. Since this memory cell eliminates punch-through of the memory transistor 402 in programming mode, the channel length 511 can be scaled. By this scalability, the channel length 511 can be reduced, and thereby the programming speed of the memory cell significantly increases in comparison with the prior art. Moreover, performing the doping to the drain 407 enables the memory cell 400 to achieve a full 5-volt programming capability.

Figure 17:
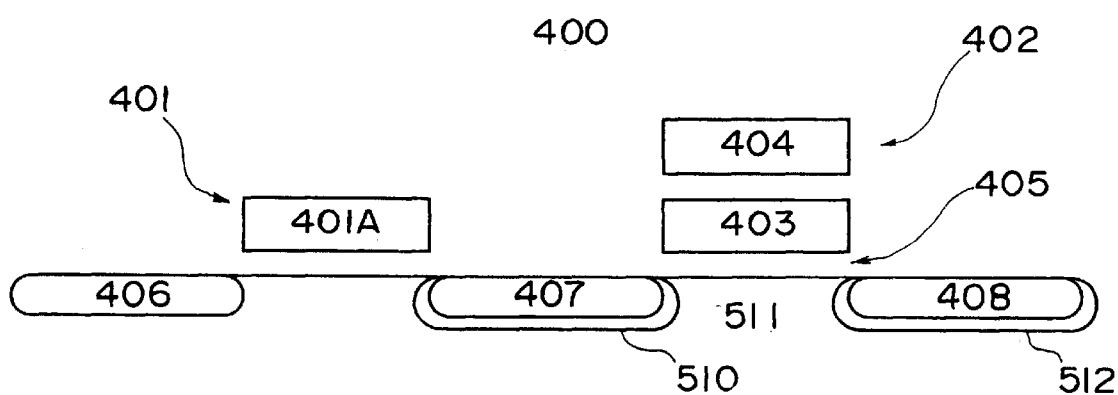
FIG. 17 is a cross-sectional view of the structure of the memory cell of FIG. 16.
Figure 19:
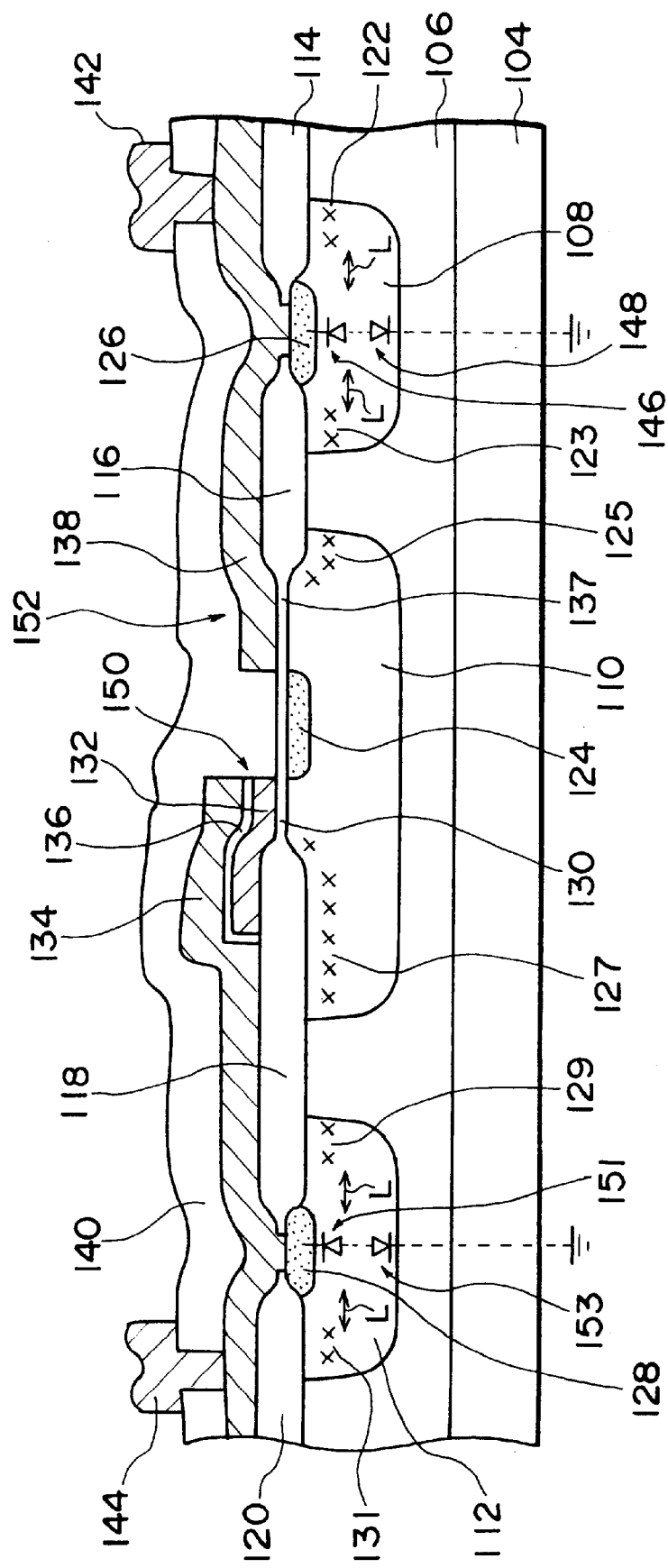
FIG. 19 is a cross-sectional view of the structure of a fifth embodiment of the non-volatile semiconductor memory device of the present invention, used in the memory cells shown in FIGS. 16 to 18.
Figure 20:
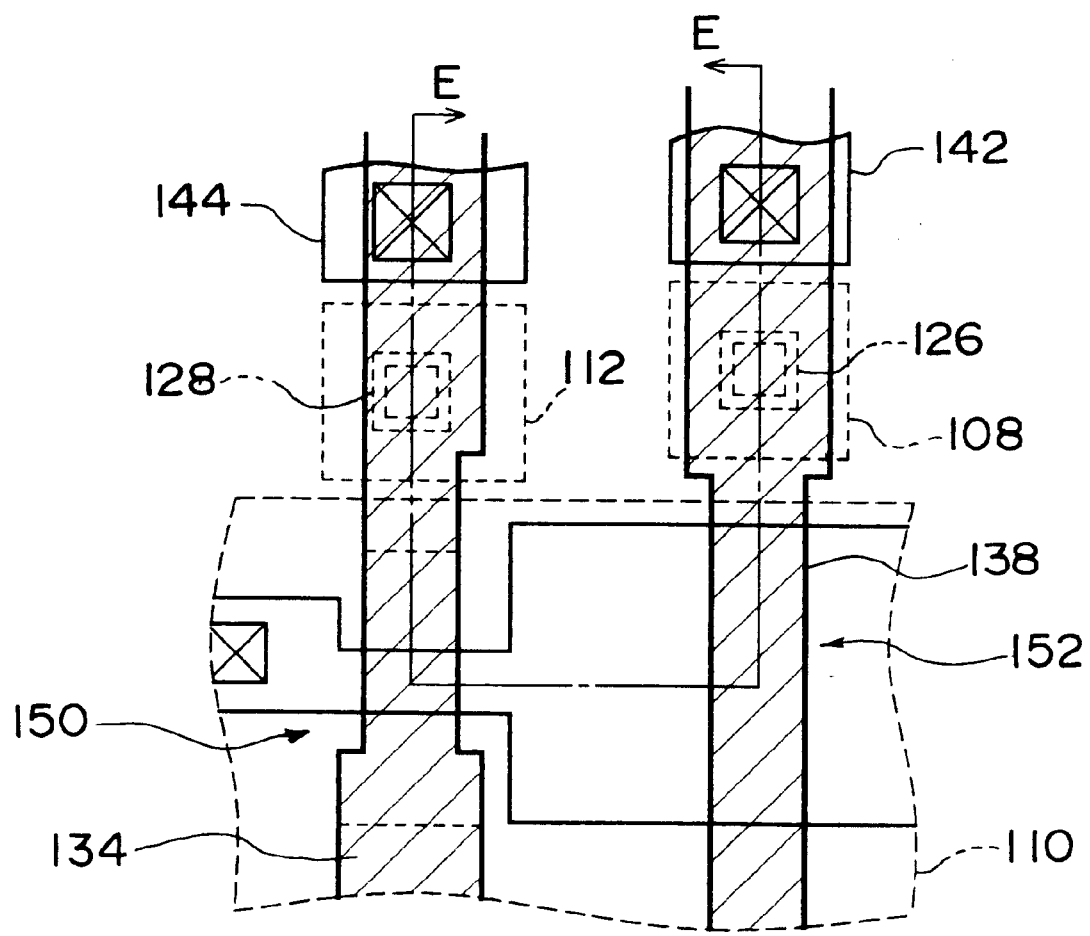
FIG. 20 is a plan view of the non-volatile semiconductor memory device of FIG. 19.

FIG. 19 shows a cross-sectional view of the structure of a non-volatile semiconductor memory device to which the present invention is applied to the memory cell of FIGS. 16 to 18. A plan view thereof is shown in FIG. 20, where a section taken along the line E—E is equivalent to the view shown in FIG. 19.

The configuration shown in FIG. 19 will now be described with reference to FIGS. 19 and 20. An N-type well 106 is formed in a P-type semiconductor substrate 104. P-type wells 108, 110, and 112 are formed at a suitable interval apart, within the N-type well 106. In addition, field oxide layers 114, 116, 118, and 120 are formed at a suitable interval apart in the main surface of the P-type semiconductor substrate 104. A source/drain region 124 is formed within the P-type well 110. A tunnel oxide film 130 is formed on the P-type well 110, within a region defined by the field oxide layer 118 and the source/drain region 124. A floating gate 132 is then formed on the tunnel oxide film 130. An ONO layer 136 is formed so as to cover the floating gate 132. A control gate 134 is formed on the ONO layer 136, with the control gate 134 extending as far as above the field oxide layer 120. A memory transistor 150 comprises the tunnel oxide film 130, the floating gate 132, the ONO layer 136, and the control gate 134.

A gate oxide film 137 is formed on top of the P-type well 110, in a region defined by the source/drain region 124 and the field oxide layer 116. A gate electrode 138 is formed on the gate oxide film 137, with the gate electrode 138 extending as far as above the field oxide layer 114. The gate electrode 138 can be formed by the same process as that of the control gate 134, for example, and an access transistor 152 comprises the gate oxide film 137 and the gate electrode 138. Note that reference numbers 125 and 127 in the figure denote channel stopper regions.

An $N^+$-type diffusion layer 128 is formed within the P-type well 112. A first junction diode 151 includes the $N^+$-type diffusion layer 128 and the P-type well 112. A second junction diode 153 includes the P-type well 112 and the N-type well 106. Channel stopper regions 129 and 131 are formed within the P-type well 112. An interval denoted by L is provided between the channel stopper region 129 and the $N^+$-type diffusion layer 128 and between the channel stopper region 131 and the $N^+$-type diffusion layer 128. The reason why the interval L is provided is the same as that of the second embodiment. The control gate 134 extends as far as above the $N^+$-type diffusion layer 128 so that the control gate 134 and the $N^+$-type diffusion layer 128 are in electrical contact.

An $N^+$-type diffusion layer 126 is formed within the P-type well 108. A third junction diode 146 includes the $N^+$-type diffusion layer 126 and the P-type well 108. A fourth junction diode 148 includes the P-type well 108 and the N-type well 106.

Channel stopper regions 122 and 123 are formed within the P-type well 108. An interval L (0.3 to 0.8 $\mu$m) is provided between the channel stopper region 122 and the $N^+$-type diffusion layer 126 and between the $N^+$-type diffusion layer 126 and the channel stopper region 123. This is to ensure that between the channel stopper region 122 and the $N^+$-type diffusion layer 126 or between the $N^+$-type diffusion layer 126 and the channel stopper region 123 is not electrically conducted by means of a voltage applied to the gate electrode 138.

The gate electrode 138 extends as far as above the $N^+$-type diffusion layer 126 so that the $^+$-type diffusion layer 126 and the gate electrode 138 are in electrical contact. An interlayer dielectric film 140 is formed over the P-type semiconductor substrate 104 so as to cover the control gate 134 and the gate electrode 138. Aluminum wire 142 and 144 is formed on the interlayer dielectric film 140. The aluminum wire 142 is connected electrically to the gate electrode 138 through a contact hole provided in the interlayer dielectric film 140 and the aluminum wire 144 is connected electrically to the control gate 134 through contact hole provided in the interlayer dielectric film 140. The $N^+$-type diffusion layers 126 and 128 could be formed by a method similar to that of the second embodiment.

In this fifth embodiment of the invention, the tunnel oxide film 130 is protected from the charging phenomenon by connecting the circuit formed by the first junction diode 151 and the second junction diode 153 to the control gate 134. Further, the gate oxide film 137 is also protected from the charging phenomenon by connecting the circuit formed by the third junction diode 146 and the fourth junction diode 148 to the gate electrode 138. In the fifth embodiment, the control gate 134 and the gate electrode 138 are both connected to protective circuits, but the tunnel oxide film 130 can still be protected from the charging phenomenon by providing a protective circuit for the control gate 134 alone.

In the above described first to fifth embodiments, a flash memory wherein information is erased and overwritten electrically is described as an application example of the embodiment, but the application of the present invention is not specifically limited to flash memory. It could also be applied to electrically programmable read-only memory (EPROM) wherein information is erased at once by applying ultraviolet light thereto but is overwritten electrically, or to electrically erasable read-only memory (EEPROM) wherein information can be erased and overwritten electrically. With EPROM, note that the configuration could be set in so that the protective circuit is activated when a potential difference, which is greater than a write voltage and read voltage applied to the memory element, is generated.

What is claimed is:

1. A non-volatile semiconductor memory device comprising a semiconductor substrate and a memory element provided with a floating gate and a control gate, said non-volatile semiconductor memory device including a first junction diode and a second junction diode, wherein:

said first junction diode functions in such manner that a reverse voltage is applied thereto when a positive voltage is applied to said control gate, and said first junction diode conducts a reverse current therethrough when a positive voltage applied to said control gate is greater than all of a write voltage, a read voltage, and an erasure voltage that are applied to said control gate;

said second junction diode is connected electrically to said first junction diode and functions in such a manner that a reverse voltage is applied thereto when a negative voltage is applied to said control gate, and said second junction diode conducts a reverse current therethrough when a negative voltage applied to said control gate has an absolute value that is greater than all of a write voltage, a read voltage, and an erasure voltage that are applied to said control gate; and a circuit formed of said first junction diode and said second junction diode is connected electrically to said control gate.

2. The non-volatile semiconductor memory device as defined in claim 1, wherein said circuit is formed within said semiconductor substrate.

3. The non-volatile semiconductor memory device as defined in claims 1, wherein:

said first junction diode comprises a first conductive region and a second conductive region;

said first conductive region is formed within said semiconductor substrate;

said second conductive region is formed within said semiconductor substrate, is connected electrically to said first conductive region, and is of a conductivity opposite to said first conductive region;

said second junction diode comprises said second conductive region and a third conductive region; and said third conductive region is formed within said semiconductor substrate, is electrically connected to said second conductive region, is of the same conductivity as that of said first conductive region.

4. The non-volatile semiconductor memory device as defined in claim 1, wherein:

said first junction diode comprises a first conductive region and a second conductive region;

said first conductive region is formed within said semiconductor substrate;

said second conductive region is formed within said semiconductor substrate, is connected electrically to said first conductive region, and is of a conductivity opposite to said first conductive region;

said second junction diode comprises said second conductive region and a third conductive region; and said third conductive region is formed within said semiconductor substrate, is electrically connected to said second conductive region, is of the same conductivity as that of said first conductive region.

5. The non-volatile semiconductor memory device as defined in claim 1, wherein:

said second junction diode comprises a first well and a second well;

said first well is formed within said semiconductor substrate;

said second well is formed within said first well and is of a conductivity opposite to said first well;

said first junction diode comprises said second well and a first conductive layer;

said first conductive layer is formed within said second well and is of the same conductivity as that of said first well; and said first conductive layer is connected electrically to said control gate.

6. The non-volatile semiconductor memory device as defined in claim 5, wherein said control gate is electrically connected to said first conductive layer, by extending said control gate up to on said first conductive layer.

7. The non-volatile semiconductor memory device as defined in claim 5, wherein said first well is N-type, said second well is P-type, and said first conductive layer is $N^+$-type.

8. The non-volatile semiconductor memory device as defined in claim 7, wherein said first well is an N-type well with an impurity density of $5.0 \times 10^{16}$ to $5.0 \times 10^{17}/cm^3$, said second well is a P-type well with an impurity density of $5.0 \times 10^{16}$ to $5.0 \times 10^{17}/cm^3$, and said first conductive layer is an $N^+$-type layer with an impurity density of $1.0 \times 10^{20}$ to $1.0 \times 10^{21}/cm^3$.

9. The non-volatile semiconductor memory device as defined in claim 5, further comprising a first channel stopper region, wherein:

said first channel stopper region is formed within said second well; and said first channel stopper region and said first conductive layer are formed with an interval provided therebetween so that said first channel stopper region and said first conductive layer are not electrically conductive when any of said write voltage, read voltage, and erasure voltage is applied thereto.

10. The non-volatile semiconductor memory device as defined in claim 9, wherein said interval is 0.3 to 0.8 $\mu$m.

11. The non-volatile semiconductor memory device as defined in claim 5, further comprising an interlayer dielectric film and a wiring layer, wherein:

(a) said interlayer dielectric film provide on said control gate and on the first conductive layer has a first contact hole and a second contact hole;

(1) said first contact hole causes said control gate to be exposed therethrough;

(2) said second contact hole causes said first conductive layer to be exposed therethrough; and (b) said wiring layer is formed on said interlayer dielectric film so that both of said control gate and said first conductive layer are electrically connected to said wiring layer through said first and second contact holes, respectively.

12. The non-volatile semiconductor memory device as defined in claim 9, further comprising an interlayer dielectric film and a wiring layer, wherein:

(a) said interlayer dielectric film provided on said control gate and on the first conductive layer has a first contact hole and a second contact hole;

(1) said first contact hole causes said control gate to be exposed therethrough;

(2) said second contact hole causes said first conductive layer to be exposed therethrough; and (b) said wiring layer is formed on said interlayer dielectric film so that both of said control gate and said first conductive layer are electrically connected to said wiring layer through said first and second contact holes, respectively.

13. The non-volatile semiconductor memory device as defined in claim 10, further comprising an interlayer dielectric film and a wiring layer, wherein:

(a) said interlayer dielectric film provided on said control gate and on the first conductive layer has a first contact hole and a second contact hole;

(1) said first contact hole causes said control gate to be exposed therethrough;

(2) said second contact hole causes said first conductive layer to be exposed therethrough; and (b) said wiring layer is formed on said interlayer dielectric film so that both of said control gate and said first conductive layer are electrically connected to said wiring layer through said first and second contact holes, respectively.

14. The non-volatile semiconductor memory device as defined in claim 1, further comprising:

a plurality of said memory elements, and a plurality of access transistors for selectively activating said memory elements, and wherein each of said access transistors selectively activates only one of said memory element.

15. The non-volatile semiconductor memory device as defined in claim 14, further comprising:

a third junction diode and a fourth junction diode; wherein:

said third junction diode functions in such a manner that a reverse voltage is applied thereto when a positive voltage is applied to a gate electrode of said access transistor, and said third junction diode conducts a reverse current therethrough in order to selectively activate said memory element when a positive voltage applied to said gate electrode is greater than a positive voltage applied to said gate electrode;

said fourth junction diode is connected electrically to said third junction diode and functions in such a manner that a reverse voltage is applied thereto when a negative voltage is applied to said gate electrode, and said fourth junction diode conducts a reverse current therethrough when a negative voltage applied to said gate electrode has an absolute value that is greater than that of a negative voltage applied to said gate electrode in order to selectively activate said memory element; and a circuit formed of said third junction diode and said fourth junction diode is connected electrically to said gate electrode.

16. The non-volatile semiconductor memory device as defined in claim 15, wherein:

(a) said fourth junction diode comprises a third well and a fourth well;
said third well is formed within said semiconductor substrate;
said fourth well is formed within said third well and is of a conductivity opposite to that of said third well;

(b) said third junction diode comprises said fourth well and a second conductive layer;
said second conductive layer is formed within said fourth well and is of the same conductivity as that of said third well; and
said second conductive layer is connected electrically to said gate electrode.

17. The non-volatile semiconductor memory device as defined in claim 16, further comprising a second channel stopper region, wherein:

said second channel stopper region is formed within said fourth well; and
said second channel stopper region and said second conductive layer are formed with an interval provided therebetween so that said second channel stopper region and said second conductive layer are not electrically conductive when a voltage is applied to said gate electrode in order to selectively activate said memory element.

18. The non-volatile semiconductor memory device as defined in claim 1, wherein:

said second junction diode comprises said semiconductor substrate and a first well;
said first well is formed within said semiconductor substrate and is of a conductivity opposite to that of said semiconductor substrate;
said first junction diode comprises said first well and a first conductive layer;
said first conductive layer is formed within said first well and is of the same conductivity as that of said semiconductor substrate; and
said first conductive layer is connected electrically to said control gate.

19. The non-volatile semiconductor memory device as defined in claim 2, wherein:

said second junction diode comprises said semiconductor substrate and a first well;
said first well is formed within said semiconductor substrate and is of a conductivity opposite to that of said semiconductor substrate;
said first junction diode comprises said first well and a first conductive layer;
said first conductive layer is formed within said first well and is of the same conductivity as that of said semiconductor substrate; and
said first conductive layer is connected electrically to said control gate.

20. The non-volatile semiconductor memory device as defined in claim 18, wherein:

said semiconductor substrate is P-type, said first well is N-type, and said first conductive layer is $P^+$-type.

* * * * *